(12) United States Patent
Sugahara et al.

(10) Patent No.: US 11,146,242 B2
(45) Date of Patent: Oct. 12, 2021

(54) FILTER DEVICE, MULTIPLEXER, RADIO FREQUENCY FRONT END CIRCUIT, AND COMMUNICATION DEVICE

(71) Applicant: Murata Manufacturing Co., Ltd., Kyoto (JP)

(72) Inventors: Tadashi Sugahara, Kyoto (JP); Hirotsugu Mori, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 67 days.

(21) Appl. No.: 16/546,827

(22) Filed: Aug. 21, 2019

(65) Prior Publication Data

US 2019/0379355 A1 Dec. 12, 2019

Related U.S. Application Data

(63) Continuation of application No. PCT/JP2018/003305, filed on Jan. 31, 2018.

(30) Foreign Application Priority Data

Feb. 28, 2017 (JP) .............................. JP2017-036603

(51) Int. Cl.
*H03H 9/54* (2006.01)
*H03H 7/01* (2006.01)
(Continued)

(52) U.S. Cl.
CPC .......... *H03H 9/542* (2013.01); *H03H 7/0161* (2013.01); *H03H 9/205* (2013.01); *H03H 9/64* (2013.01); *H03H 9/76* (2013.01)

(58) Field of Classification Search
CPC ........ H03H 9/76; H03H 7/0161; H03H 9/205; H03H 9/64
(Continued)

(56) References Cited

U.S. PATENT DOCUMENTS

| 6,472,953 B1 | 10/2002 | Sakuragawa et al. |
| 2006/0055485 A1* | 3/2006 | Lobeek .................. H03H 9/706 333/133 |

(Continued)

FOREIGN PATENT DOCUMENTS

| JP | H07231241 A | 8/1995 |
| JP | 2000-323961 A | 11/2000 |

(Continued)

OTHER PUBLICATIONS

International Search Report for International Application No. PCT/JP2018/003305 dated Mar. 27, 2018.
(Continued)

*Primary Examiner* — Hafizur Rahman
(74) *Attorney, Agent, or Firm* — Peame & Gordon LLP

(57) ABSTRACT

A filter (10) has a first passband and a second passband on a higher frequency side than the first passband and includes a series arm circuit (11) and a parallel arm circuit (12), wherein the parallel arm circuit (12) includes a parallel arm resonator (p1) connected between a node (x1) and ground and having a resonant frequency frp located between a first passband and a second passband, an inductor (L1) connected between the node (x1) and the ground, and an inductor (L2) connected between the node (x1) and the ground and connected in series to the parallel arm resonator (p1), and a circuit in which the parallel arm resonator (p1) and the inductor (L2) are connected in series is connected in parallel to the inductor (L1).

20 Claims, 16 Drawing Sheets

(51) Int. Cl.
*H03H 9/205* (2006.01)
*H03H 9/64* (2006.01)
*H03H 9/76* (2006.01)

(58) Field of Classification Search
USPC .......................................................... 333/133
See application file for complete search history.

(56) References Cited

U.S. PATENT DOCUMENTS

2007/0159274 A1    7/2007  Onzuka
2015/0222246 A1    8/2015  Nosaka

FOREIGN PATENT DOCUMENTS

| JP | 2003-298391 A | 10/2003 |
| JP | 2007-202136 A | 8/2007 |
| JP | 2008-301223 A | 12/2008 |
| WO | 2014/064987 A1 | 5/2014 |

OTHER PUBLICATIONS

Written Opinion for International Application No. PCT/JP2018/003305 dated Mar. 27, 2018.

* cited by examiner

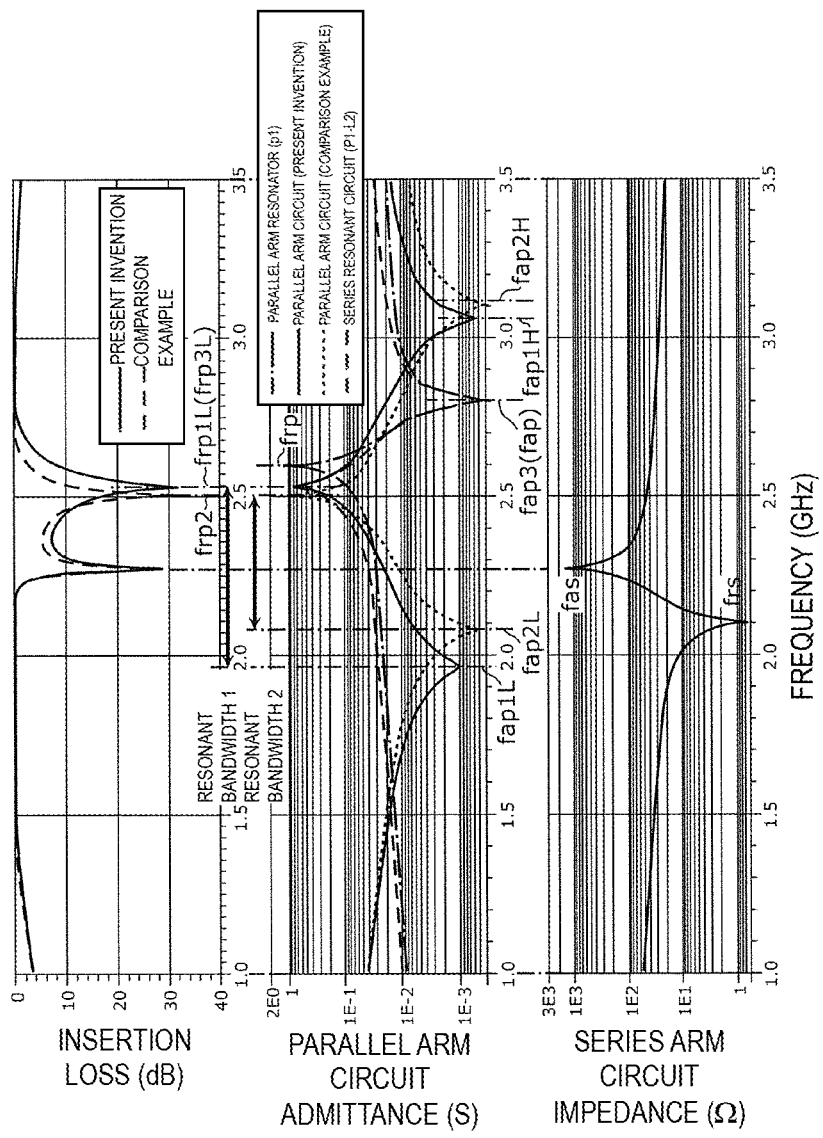

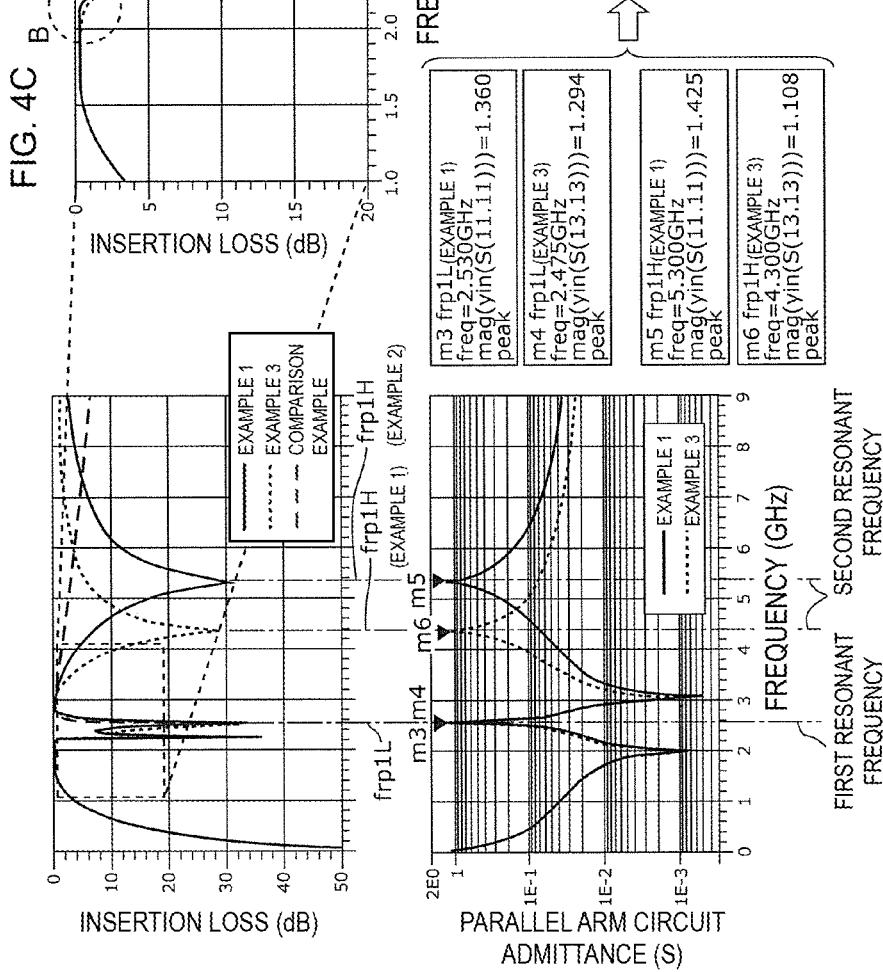

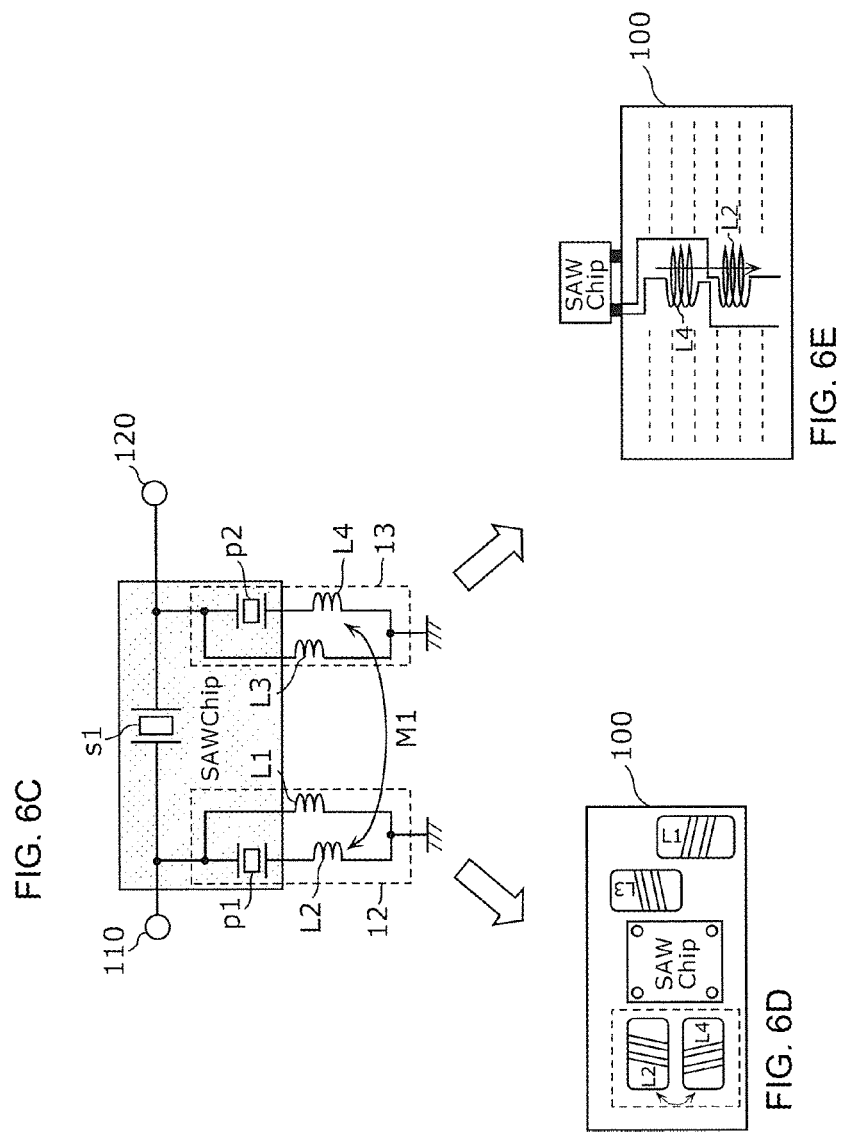

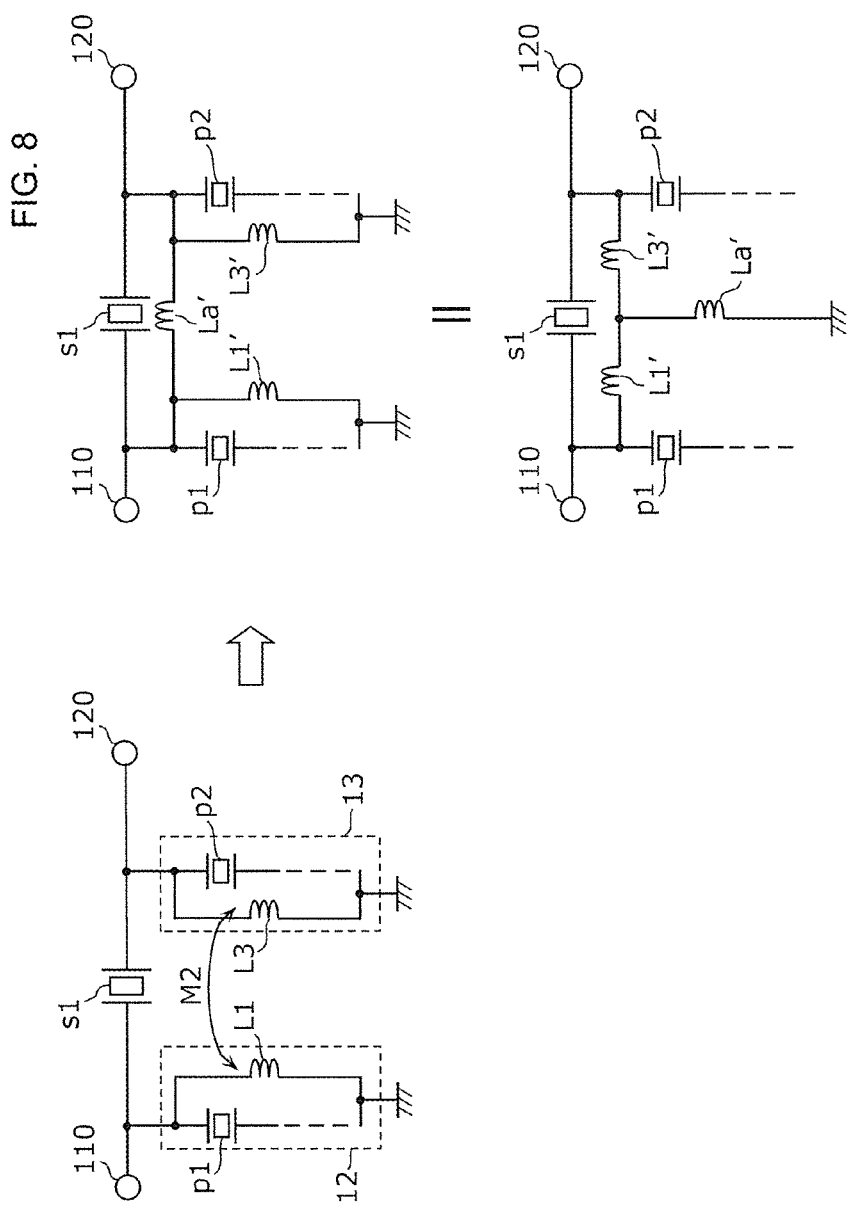

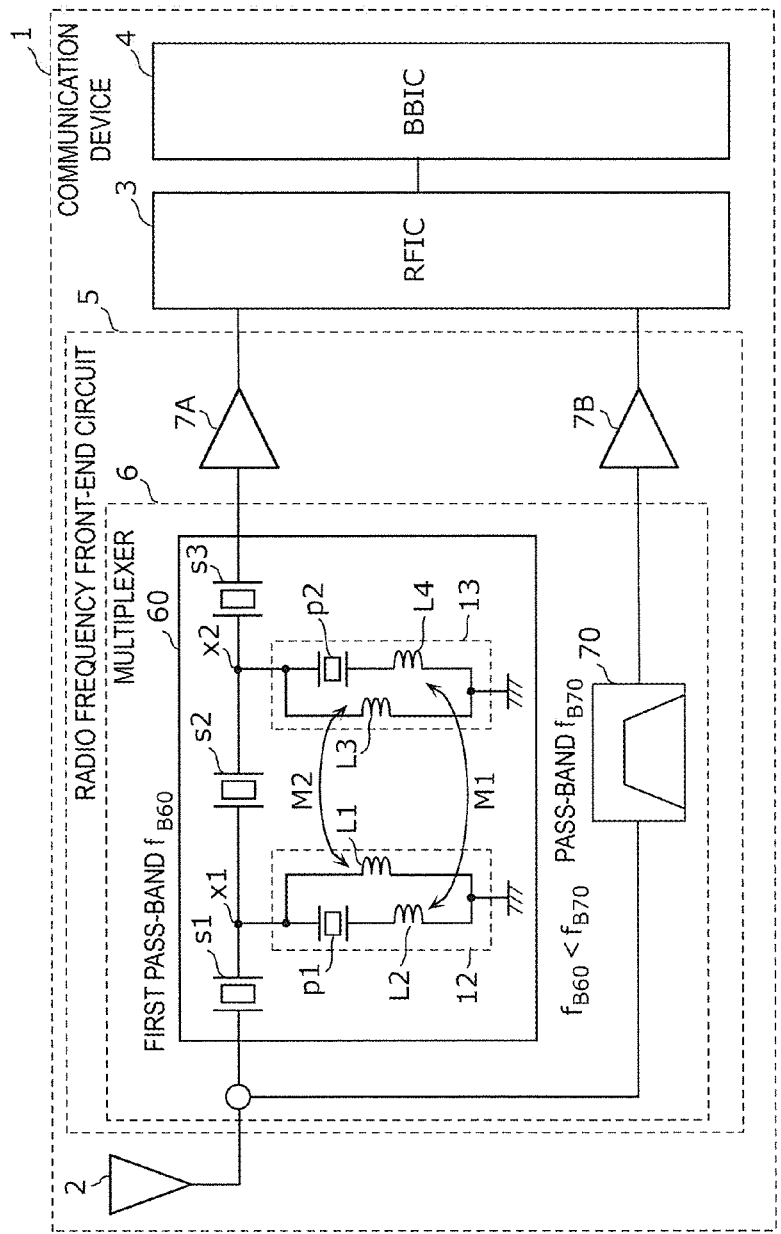

PRIOR ART

FILTER DEVICE, MULTIPLEXER, RADIO FREQUENCY FRONT END CIRCUIT, AND COMMUNICATION DEVICE

This is a continuation of International Application No. PCT/JP2018/003305 filed on Jan. 31, 2018 which claims priority from Japanese Patent Application No. 2017-036603 filed on Feb. 28, 2017. The contents of these applications are incorporated herein by reference in their entireties

BACKGROUND OF THE DISCLOSURE

Field of the Disclosure

The present disclosure relates to filter devices including resonators, multiplexers, radio frequency front-end circuits, and communication devices.

Description of the Related Art

Filters to be installed in front-end units of mobile communication devices are required to have properly adjusted width of the passband, steepness at an end part of the passband, width of the attenuation band, and the like based on a combination of bands to be used in multimode/multi-band operation.

Patent document 1 discloses the configuration of a SAW filter for use in a digital terrestrial tuner module. FIG. 12 is a circuit configuration diagram of a SAW filter described in the patent document 1. A SAW filter 500 described in FIG. 12 is formed of filter circuits 510A and 510B and an inductor 519. The filter circuit 510A is formed of a parallel arm circuit, in which a parallel arm SAW resonator 512 connected between an input port 561 and ground is connected in parallel to an inductor 514, and a series arm SAW resonator 511 connected to the input port 561. The filter circuit 510B is formed of a circuit, in which a parallel arm SAW resonator 516 connected between an output port 562 and ground is connected in parallel to an inductor 518, and a series arm SAW resonator 515 connected to the output port 562.

The SAW filter 500 forms a BEF (band elimination) circuit in which the filter circuit 510A and the filter circuit 510B are cascade-connected via the inductor 519. The SAW filter 500, which is a BEF circuit, has a first passband and a second passband that is higher in frequency than the first passband and further uses a frequency band in between the first passband and the second passband, close to the high frequency side of the first passband, as an attenuation band. Further, each SAW resonator enables to steepen an attenuation slope between the first passband and the attenuation band.

Note that in the foregoing filter 500, the first passband is set at a receiving band of a digital TV broadcasting, and the attenuation band is set at a transmitting band of voice communication. This enables to prevent a transmitting radio wave in the voice communication from interfering with a receiving wave of the digital TV broadcasting. Further, the second passband is not allocated to any receiving wave.

Patent Document 1: Japanese Unexamined Patent Application Publication No. 2007-202136

BRIEF SUMMARY OF THE DISCLOSURE

In the SAW filter 500 described in the patent document 1, two attenuation poles in the attenuation band close to the high frequency side of the first passband are formed by an anti-resonant frequency of the series arm SAW resonator 511 and a resonant frequency of the foregoing parallel arm circuit.

However, the frequency difference between these two attenuation poles existing near the attenuation band close to the high frequency side of the first passband is small. Therefore, if the width of the attenuation band adjacent to the high frequency side of the first passband were to be extended, it would be necessary to widen the frequency difference between the foregoing two attenuation poles. However, if the frequency difference between the foregoing two attenuation poles were widened, bounce-back between the attenuation poles would be larger (the attenuation would be smaller), thereby posing an issue of not being able to obtain sufficient attenuation in the attenuation band close to the high frequency side of the first passband.

Further, because a resonant frequency and an anti-resonant frequency for forming an attenuation pole in a band on the higher frequency side than the second passband do not exist and thus no large attenuation can be obtained in the band on the higher frequency side than the second passband, there is an issue that the foregoing BEF circuit cannot sufficiently remove harmonic spurious waves generated in, for example, an amplifier.

In view of the above, the present disclosure is made to resolve the foregoing issues, and an object thereof is to provide a filter device, a multiplexer, a radio frequency front-end circuit, and a communication device, each of which broadens the width of an attenuation band close to the high frequency side of a first passband while maintaining a state where an attenuation slope on the high frequency side of the first passband is steepened and improves the attenuation in a band on the higher frequency side than a second passband that is higher in frequency than the first passband.

In order to achieve the foregoing object, a radio frequency filter according to one aspect of the present disclosure is a filter device having a first passband and a second passband that is higher in frequency than the first passband, the filter device including: a series arm circuit connected between a first input/output terminal and a second input/output terminal; and a first parallel arm circuit connected to a first node on a path connecting the first input/output terminal and the second input/output terminal and ground, wherein the first parallel arm circuit includes a first parallel arm resonator connected between the first node and the ground and having a resonant frequency located between the first passband and the second passband, a first inductor connected between the first node and the ground, and a second inductor connected between the first node and the ground and connected in series to the first parallel arm resonator, and a circuit in which the first parallel arm resonator and the second inductor are connected in series is connected in parallel to the first inductor.

This enables the filter device to form a filter being defined by the first parallel arm circuit and the series arm circuit. The first parallel arm circuit is formed of the first parallel arm resonator, the second inductor connected in series to the first parallel arm resonator, and the first inductor connected in parallel to a series circuit of the first parallel arm resonator and the second inductor, and thus, two resonant frequencies and two anti-resonant frequencies are defined.

This enable to widen the frequency difference between the anti-resonant frequency on the low frequency side of the first parallel arm circuit, which forms the first passband, and the resonant frequency on the low frequency side, which forms the attenuation band close to the high frequency side of the first passband, and therefore, the frequency difference of two attenuation poles existing near the attenuation band close to the high frequency side of the first passband can be widened without worsening the bounce-back. That is to say, the width of the attenuation band close to the high frequency side of the first passband can be widened. Further, this enables to form the resonant frequency on the high frequency side of the first parallel arm circuit at a higher frequency position than the anti-resonant frequency on the high frequency side, which forms the second passband, and thus, it becomes possible to form the attenuation pole at a higher frequency side than the second passband, thereby improving the attenuation in a higher frequency band than the second passband.

Further, the first parallel arm circuit may have a first resonant frequency and a second resonant frequency located on a higher frequency side than the first resonant frequency, and the second resonant frequency may be lower than a frequency three times as much as the first resonant frequency.

This causes the second resonant frequency that defines the attenuation pole in a band on a higher frequency side than the second passband to be located in a band extending up to the third harmonic wave, and thus enables to improve the attenuation characteristic up to the third-order harmonic wave. Further, this enables to improve the attenuation in the attenuation band near the high frequency side of the passband.

Further, the second resonant frequency may be higher than a frequency twice as much as the first resonant frequency.

When the second resonant frequency is equal to or lower than a frequency twice as much as the first resonant frequency, the first and second resonant frequencies approach too close to the passband, and thus the insertion loss at an end part of a high frequency region of the first passband degrades. Because the second resonant frequency is higher than a frequency twice as much as the first resonant frequency, this enables to improve the attenuation characteristic up to the third-order harmonic wave while securing the low-loss of the first passband.

Further, an inductance value of the second inductor may be smaller than an inductance value of the first inductor.

This widens the frequency difference between the anti-resonant frequency on the low frequency side of the first parallel arm circuit and the resonant frequency on the low frequency side, and thus enables to improve the insertion loss of the passband.

Further, the first parallel arm circuit may further include a first switch connected in parallel to the second inductor.

This enables to vary the anti-resonant frequency on the low frequency side of the first parallel arm circuit, the resonant frequency on the high frequency side, and the anti-resonant frequency on the high frequency side by switching between the electrically continuous state and the electrically discontinuous state of the first switch, and thus enables to vary the frequency of the passband and the width of the attenuation band.

Further, the filter device may further include a second parallel arm circuit connected to a second node and the ground, the second node being on the path and being different from the first node, wherein the second parallel arm circuit may include a second parallel arm resonator connected between the second node and the ground and having a resonant frequency located between the first passband and the second passband, a third inductor connected between the second node and the ground, a fourth inductor connected between the second node and the ground and connected in series to the second parallel arm resonator, and a second switch connected in parallel to the fourth inductor, and a circuit in which the second parallel arm resonator and the fourth inductor are connected in series may be connected in parallel to the third inductor.

This enables to vary the anti-resonant frequencies on the low frequency sides of the first parallel arm circuit and the second parallel arm circuit, the resonant frequencies on the high frequency side, and the anti-resonant frequencies on the high frequency side by switching between the electrically continuous states and the electrically discontinuous states of the first switch and the second switch, and thus enables to vary the frequency of the passband and the width of the attenuation band with a high degree of accuracy.

Further, the second parallel arm circuit may have a third resonant frequency and a fourth resonant frequency located on a higher frequency side than the third resonant frequency, and the fourth resonant frequency may be lower than a frequency three times as much as the third resonant frequency.

This causes the fourth resonant frequency that defines the attenuation pole in a band on a higher frequency side than the second passband to be located in a band extending up to the third harmonic wave, and thus enables to improve the attenuation characteristic up to the third-order harmonic wave. Further, this enables to improve the attenuation in the attenuation band near the high frequency side of the passband.

Further, the fourth resonant frequency may be higher than a frequency twice as much as the third resonant frequency.

When the fourth resonant frequency is equal to or lower than a frequency twice as much as the third resonant frequency, the third and fourth resonant frequencies approach too close to the passband, and thus the insertion loss at an end part of a high frequency region of the first passband degrades. Because the fourth resonant frequency is higher than a frequency twice as much as the third resonant frequency, this enables to improve the attenuation characteristic up to the third-order harmonic wave while securing the low-loss of the first passband.

Further, an inductance value of the fourth inductor may be smaller than an inductance value of the third inductor.

This widens the frequency difference between the anti-resonant frequency on the low frequency side of the second parallel arm circuit and the resonant frequency on the low frequency side, and thus enables to improve the insertion loss of the passband.

Further, the filter device may further include a second parallel arm circuit connected to a second node and the ground, the second node being on the path and being different from the first node, wherein the second parallel arm circuit may include a second parallel arm resonator connected between the second node and the ground and having a resonant frequency located between the first passband and the second passband, a third inductor connected between the second node and the ground, and a fourth inductor connected between the second node and the ground and connected in series to the second parallel arm resonator, a circuit in which the second parallel arm resonator and the fourth inductor are connected in series may be connected in parallel to the third inductor, and the second inductor and the fourth inductor may be magnetically coupled.

Compared with the configuration in which the second inductor and the fourth inductor are not magnetically coupled, this enables to extend the width of the first passband and improve the attenuation in a band on a higher frequency side than the second passband.

Further, the second parallel arm circuit may have a third resonant frequency and a fourth resonant frequency located on a higher frequency side than the third resonant frequency, and the fourth resonant frequency may be lower than a frequency three times as much as the third resonant frequency.

This causes the fourth resonant frequency that defines the attenuation pole in a band on a higher frequency side than the second passband to be located in a band extending up to the third harmonic wave, and thus enables to improve the attenuation characteristic up to the third-order harmonic wave. Further, this enables to improve the attenuation in the attenuation band near the high frequency side of the passband.

Further, the fourth resonant frequency may be higher than a frequency twice as much as the third resonant frequency.

When the fourth resonant frequency is equal to or lower than a frequency twice as much as the third resonant frequency, the third and fourth resonant frequencies approach too close to the passband, and thus the insertion loss at an end part of a high frequency region of the first passband degrades. Because the fourth resonant frequency is higher than a frequency twice as much as the third resonant frequency, this enables to improve the attenuation characteristic up to the third-order harmonic wave while securing the low-loss of the first passband.

Further, an inductance value of the fourth inductor may be smaller than an inductance value of the third inductor.

This widens the frequency difference between the anti-resonant frequency on the low frequency side of the second parallel arm circuit and the resonant frequency on the low frequency side, and thus enables to improve the insertion loss of the passband.

Further, the first inductor and the third inductor may be magnetically coupled.

This enables to extend the width of the first passband and improve the attenuation characteristic in a high frequency band of the second passband and further enables to steepen an attenuation slope on the low frequency side of the first passband.

Further, the first parallel arm circuit may further include a first switch connected in parallel to the second inductor, and the second parallel arm circuit may further include a second switch connected in parallel to the fourth inductor.

This enables to vary the resonant frequencies of the first parallel arm circuit and the second parallel arm circuit while magnetically coupling the second inductor and the fourth inductor by switching between the electrically continuous states and the electrically discontinuous states of the first switch and the second switch, and thus enables to vary the width of the attenuation band with a high degree of accuracy.

Further, the series arm circuit may include a series arm resonator connected between the first input/output terminal and the second input/output terminal; a resonant frequency of the series arm resonator may be lower than a resonant frequency of the first parallel arm resonator; the first parallel arm circuit may have a first resonant frequency, a second resonant frequency located on a higher frequency side than the first resonant frequency, a first anti-resonant frequency, and a second anti-resonant frequency located on a higher frequency side than the first anti-resonant frequency; the resonant frequency of the series arm resonator and the first anti-resonant frequency of the first parallel arm circuit may be located within the first passband; an anti-resonant frequency of the series arm resonator and the first resonant frequency of the first parallel arm circuit may define a first attenuation band on a high frequency side close to the first passband; the second anti-resonant frequency of the first parallel arm circuit may define the second passband; and the second resonant frequency of the first parallel arm circuit may define a second attenuation band on a higher frequency side than the second passband.

This enables to realize a removing filter (band elimination filter) in which the width of the attenuation band is extended by using the series arm circuit and the first parallel arm circuit.

Further, the series arm circuit may include a series arm resonator connected between the first input/output terminal and the second input/output terminal; a resonant frequency of the series arm resonator may be lower than a resonant frequency of the first parallel arm resonator; the first parallel arm circuit may have a first resonant frequency, a second resonant frequency located on a higher frequency side than the first resonant frequency, a first anti-resonant frequency, and a second anti-resonant frequency located on a higher frequency side than the first anti-resonant frequency; the second parallel arm circuit may have a third resonant frequency, a fourth resonant frequency located on a higher frequency side than the third resonant frequency, a third anti-resonant frequency, and a fourth anti-resonant frequency located on a higher frequency side than the third anti-resonant frequency; the resonant frequency of the series arm resonator, the first anti-resonant frequency, and the third anti-resonant frequency may be located within the first passband; an anti-resonant frequency of the series arm resonator, the first resonant frequency, and the third resonant frequency may define a first attenuation band on a high frequency side close to the first passband; the second anti-resonant frequency and the fourth anti-resonant frequency may define the second passband; and the second resonant frequency and the fourth resonant frequency may define a second attenuation band on a higher frequency side than the second passband.

This enables to realize the band removing filter in which the width of the attenuation band is extended by using the series arm circuit, the first parallel arm circuit, and the second parallel arm circuit.

Further, a multiplexer according to an aspect of the present disclosure may include a common terminal, the foregoing filter device, and a first filter having a passband on a higher frequency side than a passband of the filter device, wherein the first input/output terminal and the first filter may be connected to the common terminal.

This broadens the attenuation band on the high frequency side of the first passband of the filter device, and thus enables to reduce the insertion loss of the first filter that uses this attenuation band as the passband.

Further, a radio frequency front-end circuit according to one aspect of the present disclosure may include the filter device described above and an amplifier circuit connected to this filter device.

This enables to provide the radio frequency front-end circuit including the filter device in which the width of the attenuation band near the high frequency side of the first passband is extended.

Further, a communication device according to one aspect of the present disclosure includes a RF signal processing circuit that processes a radio frequency signal being transmitted or received by an antenna element and the radio frequency front-end circuit described above that transmits the radio frequency signal between the antenna element and the RF signal processing circuit.

This enables to provide the communication device including the filter device in which the width of the attenuation band near the high frequency side of the first passband is extended.

Each of the filter device, the multiplexer, the radio frequency front-end circuit, and the communication device according to the present disclosure enables to broaden the width of the attenuation band close to the high frequency side of the first passband while maintaining the state where the attenuation slope on the high frequency side of the first passband is steepened and improve the attenuation in the band on the higher frequency side than the second passband that is higher in frequency than the first passband.

BRIEF DESCRIPTION OF THE SEVERAL VIEWS OF THE DRAWINGS

FIG. 2D is an enlarged graph illustrating transmission characteristics of the filter devices according to the embodiment 1 and the comparison example, admittance characteristics of the parallel arm circuits, and the impedance characteristic of the series arm circuits.

Figures 3A, 3B, 3C:
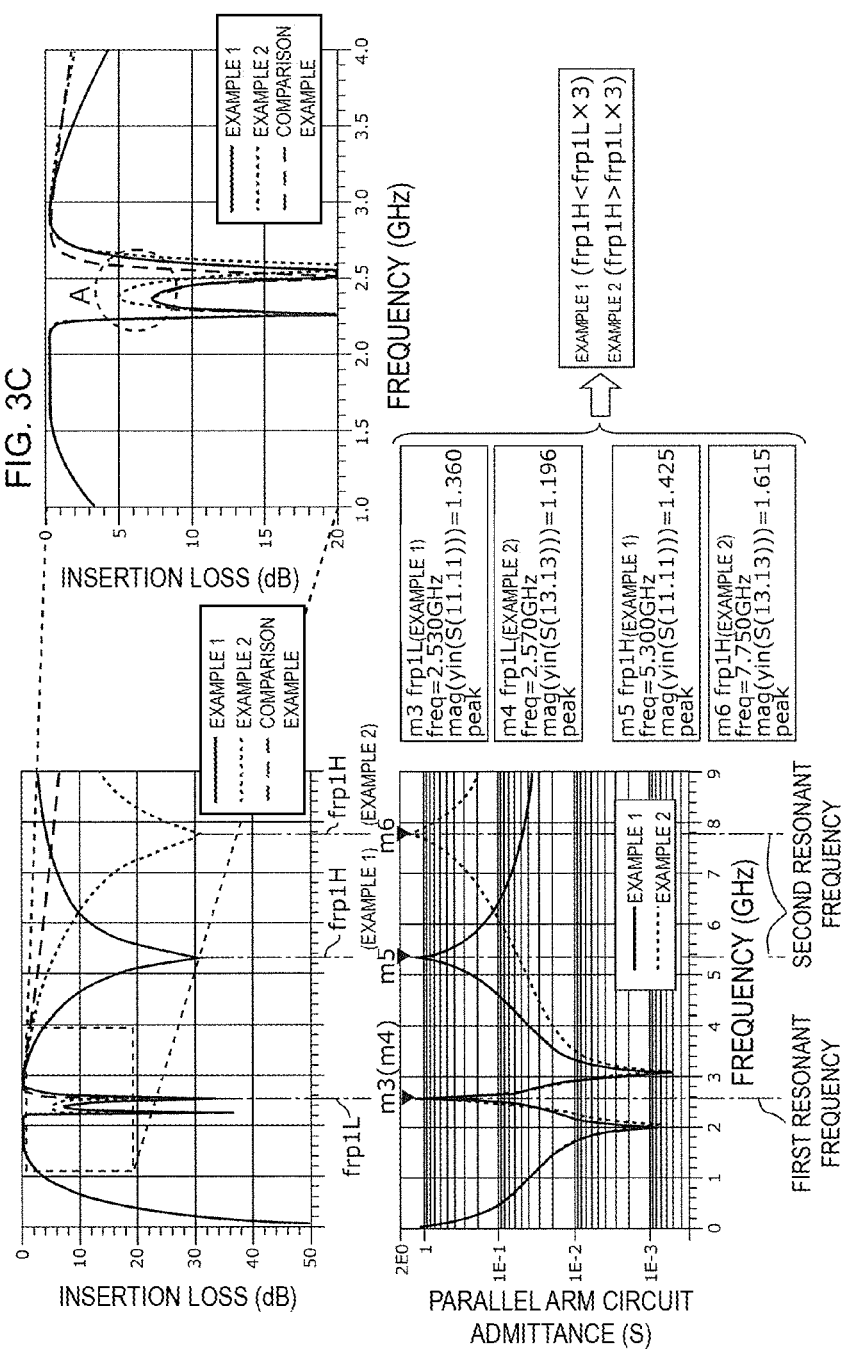

Each of FIGS. 3A, 3B and 3C is a graph comparing transmission characteristics and admittance characteristics of the filter devices according to examples and the comparison example.

Each of FIGS. 4A, 4B and 4C is a graph comparing transmission characteristics and admittance characteristics of the filter devices according to examples and the comparison example.

Figure 5A:
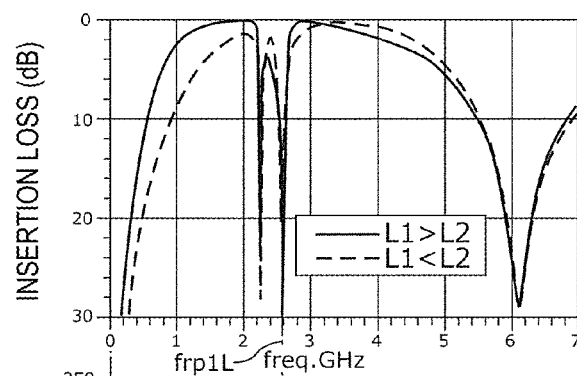
Figure 5B:
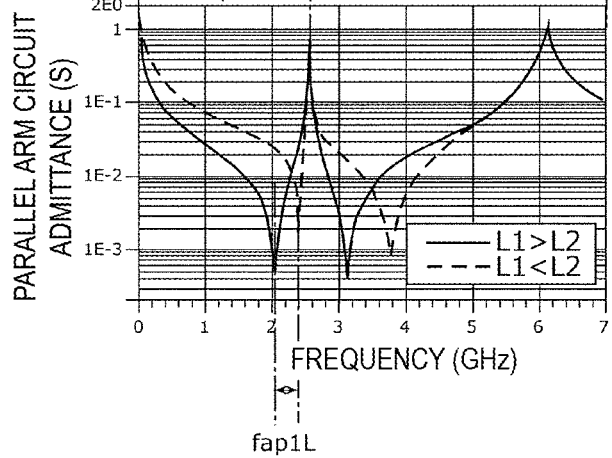

Each of FIGS. 5A and 5B is a graph comparing transmission characteristics and admittance characteristics of the parallel arm circuit of the filter device according to the embodiment 1 based on a magnitude relationship between a first inductor and a second inductor.

Figure 6A:
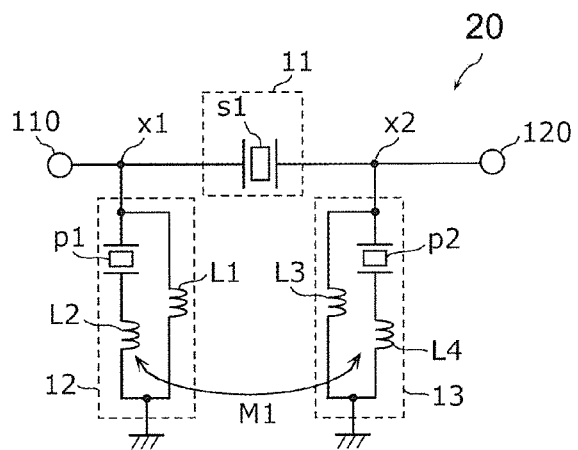

FIG. 6A is a specific circuit configuration diagram of a filter device according to an embodiment 2.

Figure 6B:
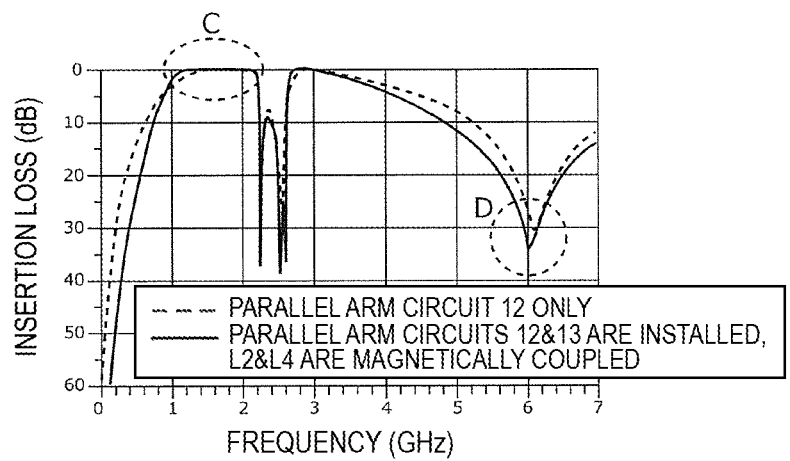

FIG. 6B is a graph comparing transmission characteristics of the filter device according to the embodiment 2 based on presence or absence of magnetic coupling.

FIGS. 6C, 6D and 6E are a circuit configuration diagram, a plan view and a cross-sectional view illustrating a board mounting configuration of the filter device according to the embodiment 2.

Figure 7A:
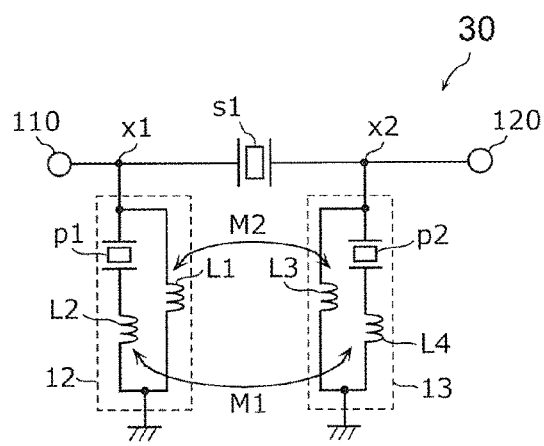

FIG. 7A is a specific circuit configuration diagram of a filter device according to a modified example of the embodiment 2.

Figure 7B:
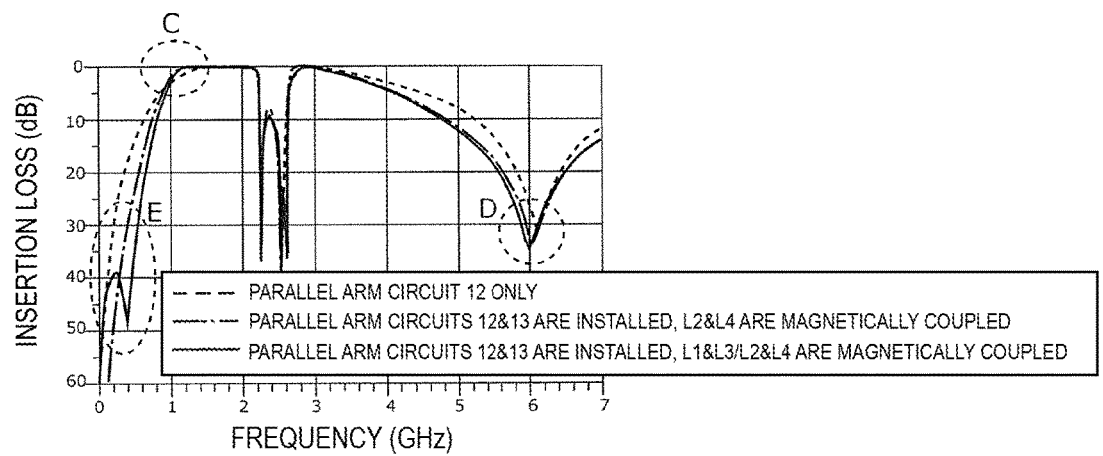

FIG. 7B is a graph comparing transmission characteristics of the filter device according to the modified example of the embodiment 2 based on presence or absence of magnetic coupling.

Figure 7C:
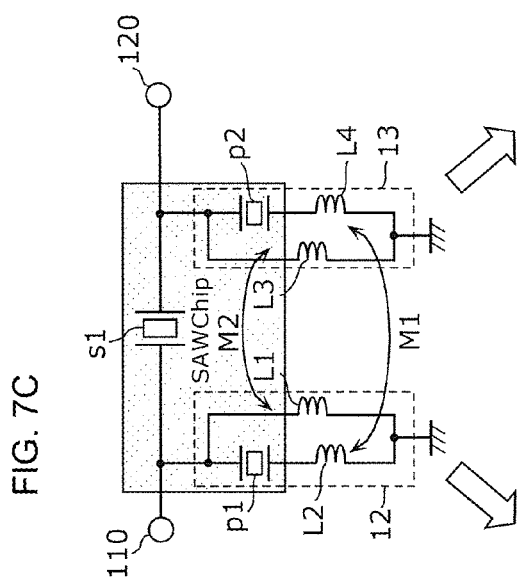
Figure 7E:
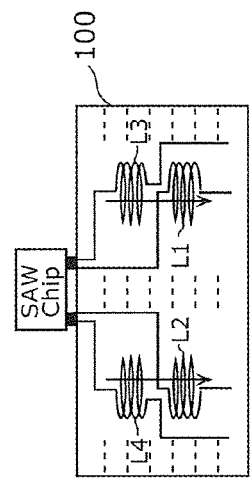
Figure 7D:
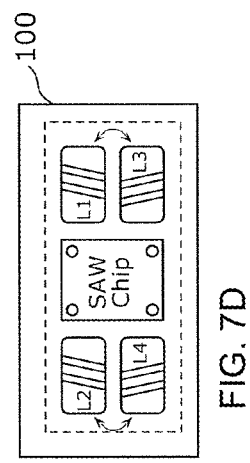

FIGS. 7C, 7D and 7E are a circuit configuration diagram, a plan view and a cross-sectional view illustrating a board mounting configuration of the filter device according to the modified example of the embodiment 2.

FIG. 8 is a diagram illustrating a circuit configuration of the filter device according to the modified example of the embodiment 2 for magnetic coupling.

Figure 9A:
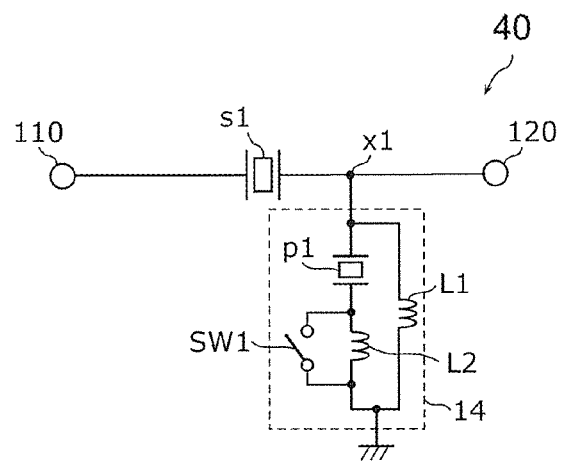

FIG. 9A is a specific circuit configuration diagram of a filter device according to an embodiment 3.

Figure 9B:
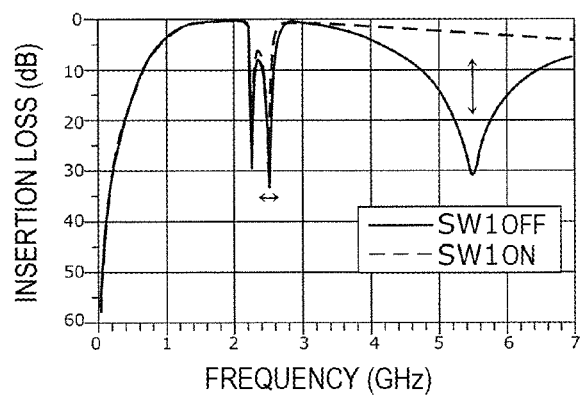

FIG. 9B is a graph comparing transmission characteristics of the filter device according to the embodiment 3 based on switch's on/off operation.

Figure 10A:
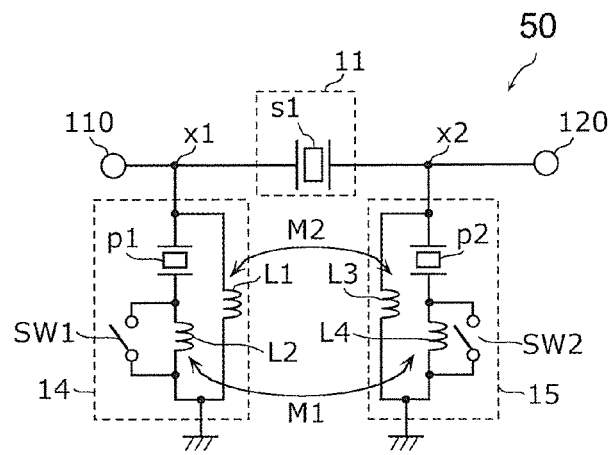

FIG. 10A is a specific circuit configuration diagram of a filter device according to a modified example of the embodiment 3.

Figure 10B:
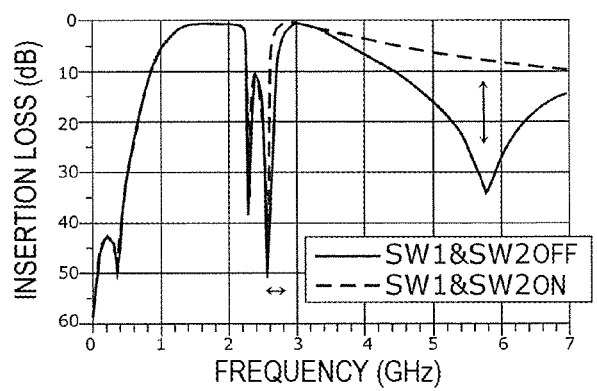

FIG. 10B is a graph comparing transmission characteristics of the filter device according to the modified example of the embodiment 3 based on switch's on/off operation.

FIG. 11A is a circuit configuration diagram of a multiplexer, a radio frequency front-end circuit, and a communication device according to an embodiment 4.

Figure 11B:
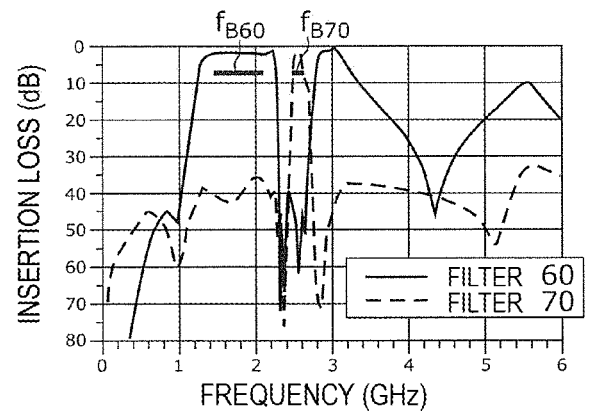

FIG. 11B is a graph illustrating transmission characteristics of the multiplexer according to the embodiment 4.

Figure 11C:
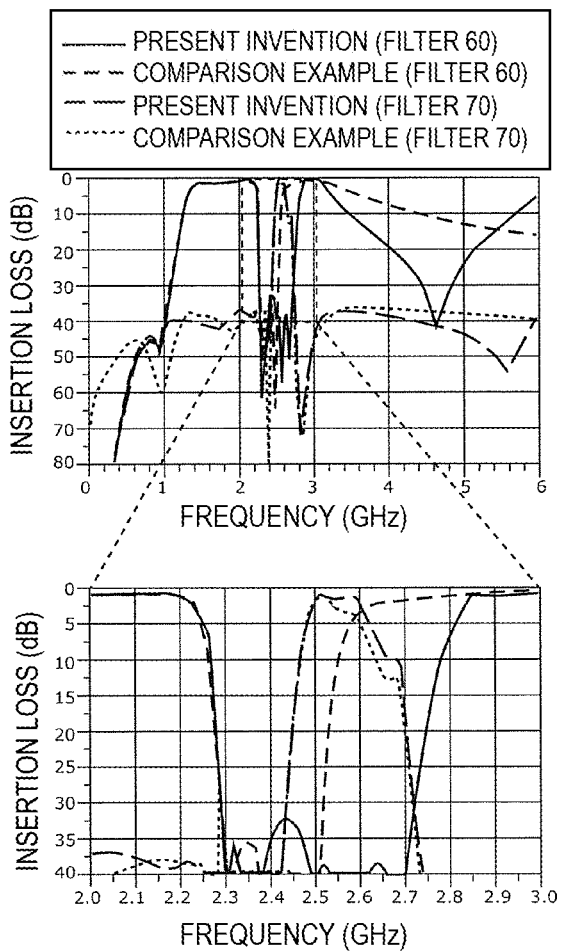

FIG. 11C is a graph comparing transmission characteristics of multiplexers according to the embodiment 4 and a comparison example.

Figure 12:
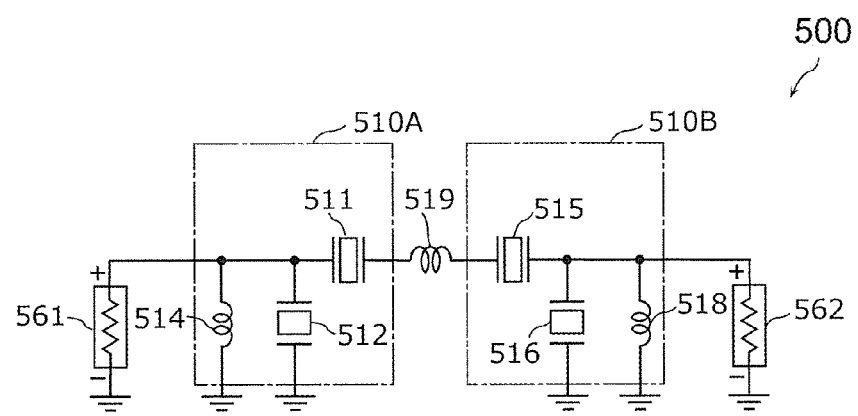

FIG. 12 is a circuit configuration diagram of a SAW filter described in the patent document 1.

DETAILED DESCRIPTION OF THE DISCLOSURE

Hereinafter, embodiments of the present disclosure are described in detail using examples and the drawings. Note that each of the embodiments, which will be described below, illustrates a comprehensive or specific example. Numeric values, shapes, materials, constituting elements, arrangements and connection modes of the constituting elements, and the like illustrated in the following embodiments are mere examples and not intended to limit the present disclosure. Of constituting elements in the following embodiments, the constituting elements that are not described in an independent claim will be described as optional constituting elements. Further, dimensions or ratios of dimensions of constituting elements illustrated in the drawings are not necessarily precise.

Further, unless otherwise described, the resonant frequency of a resonator or a circuit is a resonant frequency for forming a passband or an attenuation pole near the passband of a filter including the resonator or the circuit, and is the frequency of a "resonant point" that is a singular point where the impedance of the resonator or the circuit is a local minimum (ideally, a point where the impedance is 0) or a singular point where the admittance of the resonator or the circuit is a local maximum (ideally, a point where the admittance is infinite).

Further, unless otherwise described, the anti-resonant frequency of a resonator or a circuit is an anti-resonant frequency for forming a passband or an attenuation pole near the passband of a filter including the resonator or the circuit, and is the frequency of a "anti-resonant point" that is a singular point where the impedance of the resonator or the circuit is a local maximum (ideally, a point where the impedance is infinite) or a singular point where the admittance of the resonator or the circuit is a local minimum (ideally, a point where the admittance is 0).

Note that in the following embodiments, a series arm circuit and a parallel arm circuit are defined as follows.

The parallel arm circuit is a circuit installed between a node and ground, and the node is on a path connecting a first input/output terminal and a second input/output terminal.

The series arm circuit is a circuit installed between the first input/output terminal or the second input/output terminal and a node on the foregoing path to which a parallel arm circuit is connected, or a circuit installed between one node on the foregoing path to which one parallel arm circuit is connected and another node on the foregoing path to which another parallel arm circuit is connected.

Embodiment 1

[1.1 Configuration of Filter Device]

Figure 1:
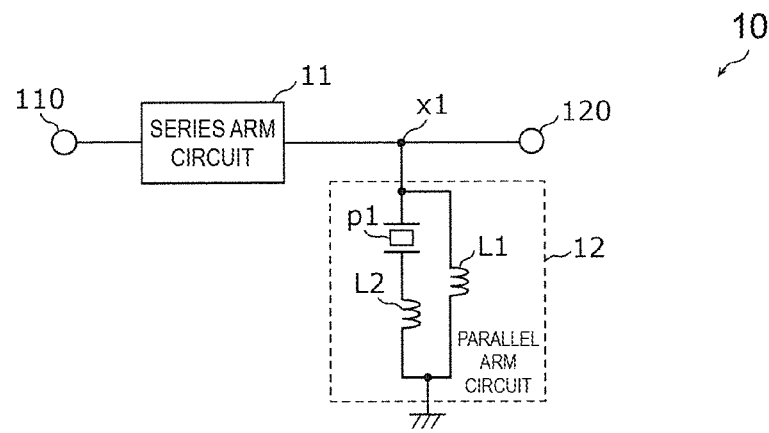
FIG. 1 is a circuit configuration diagram of a filter device according to an embodiment 1.

FIG. 1 is a circuit configuration diagram of a filter 10 according to an embodiment 1. The filter 10 illustrated in FIG. 1 includes a series arm circuit 11, a parallel arm circuit 12, and input/output terminals 110 and 120, and has a first passband and a second passband that is higher in frequency than the first passband.

The series arm circuit 11 is connected between the input/output terminal 110 (first input/output terminal) and the input/output terminal 120 (second input/output terminal).

The parallel arm circuit 12 is a first parallel arm circuit connected to a node x1 (first node) on a path connecting the input/output terminal 110 and the input/output terminal 120 and ground (reference terminal).

Figure 2A:
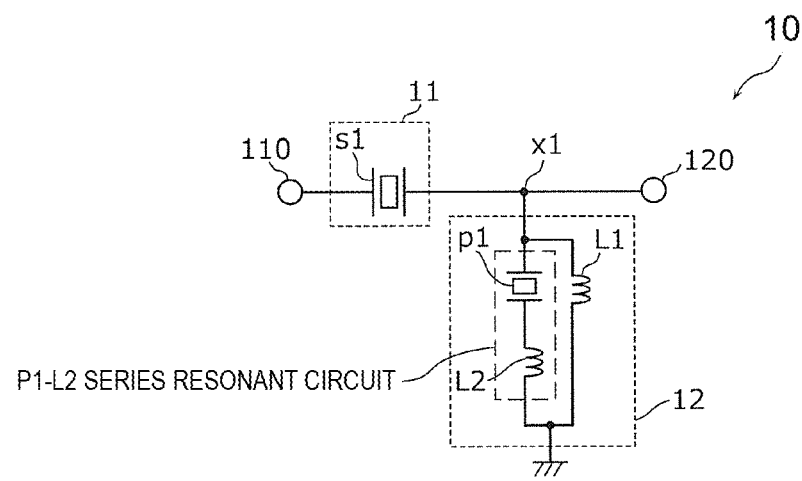
FIG. 2A is a specific circuit configuration diagram of a filter device according to the embodiment 1.

FIG. 2A is a specific circuit configuration diagram of the filter 10 according to the embodiment 1. In the present embodiment, as a specific configuration example of the series arm circuit 11, a series arm resonator s1, which is an acoustic wave resonator, connected between the input/output terminal 110 and the input/output terminal 120 may be used. That is to say, the series arm circuit 11 includes the series arm resonator s1 provided in a series arm connecting the input/output terminal 110 and the input/output terminal 120.

Note that in the present embodiment, the series arm circuit 11 is formed of a single acoustic wave resonator (series arm resonator s1), however, the series arm circuit 11 may alternatively be formed of a plurality of acoustic wave resonators. The series arm circuit formed of a plurality of acoustic wave resonators may include, for example, a longitudinally coupled resonator composed of a plurality of acoustic wave resonators or a plurality of split resonators formed by serially splitting a single acoustic wave resonator or the like. For example, the use of a longitudinally coupled resonator as a series arm circuit enables the series arm resonator to be fit to the filter characteristics for which enhancement of attenuation and the like are required. Further, the series arm circuit 11 may alternatively be a circuit that is formed of at least one of an inductor and a capacitor and not including any acoustic wave resonator.

The parallel arm circuit 12 includes a parallel arm resonator p1 and inductors L1 and L2.

The parallel arm resonator p1 is a first parallel arm resonator that is connected between the node x1 and the ground and has a resonant frequency frp located between the first passband and the second passband of the filter 10.

The inductor L2 is a second inductor connected between the node x1 and the ground and connected in series to the parallel arm resonator p1.

The inductor L1 is a first inductor connected between the node x1 and the ground. The inductor L1 and the circuit in which the parallel arm resonator p1 and the inductor L2 are connected in series are connected in parallel between the node x1 and the ground.

Note that in the present embodiment, the parallel arm resonator p1 forming the parallel arm circuit 12 is formed of, for example, a single acoustic wave resonator, however, the parallel arm resonator p1 may alternatively be formed of a plurality of split resonators which are serially split.

Further, each of the series arm resonator s1 and the parallel arm resonator p1 may be a surface acoustic wave (SAW) filter or an acoustic wave filter using bulk acoustic wave (BAW). This enables each of the series arm resonator s1 and the parallel arm resonator p1 to be downsized, thereby enabling the reduction in size and cost of the filter 10. Further, the surface acoustic wave filter and the acoustic wave filter using BAW generally have a high Q characteristic, and this enables to reduce loss and increase selectivity.

Further, the parallel arm resonator p1 may alternatively be formed of a circuit including a LC resonant circuit composed of an inductor and a capacitor as long as the parallel arm resonator p1 has a resonant frequency at which the admittance is a local maximum and an anti-resonant frequency at which the admittance is a local minimum.

Figure 2B:
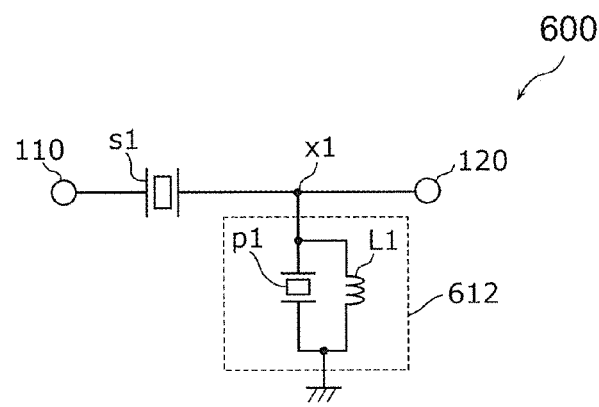
FIG. 2B is a circuit configuration diagram of a filter device according to a comparison example.

FIG. 2B is a circuit configuration diagram of a filter 600 according to a comparison example. As illustrated in FIG. 2B, compared with the filter 10 according to the embodiment 1, the filter 600 according to the comparison example has a different configuration in which the inductor L2 is not installed therein. The filter 600 includes a series arm resonator s1, a parallel arm circuit 612, and input/output terminals 110 and 120.

The parallel arm circuit 612 includes a parallel arm resonator p1 and the inductor L1.

The inductor L1 is connected between the node x1 and the ground, and the inductor L1 and the parallel arm resonator p1 are connected in parallel between the node x1 and the ground.

[1.2 Resonant Characteristic and Transmission Characteristic of Filter]

Figure 2C:
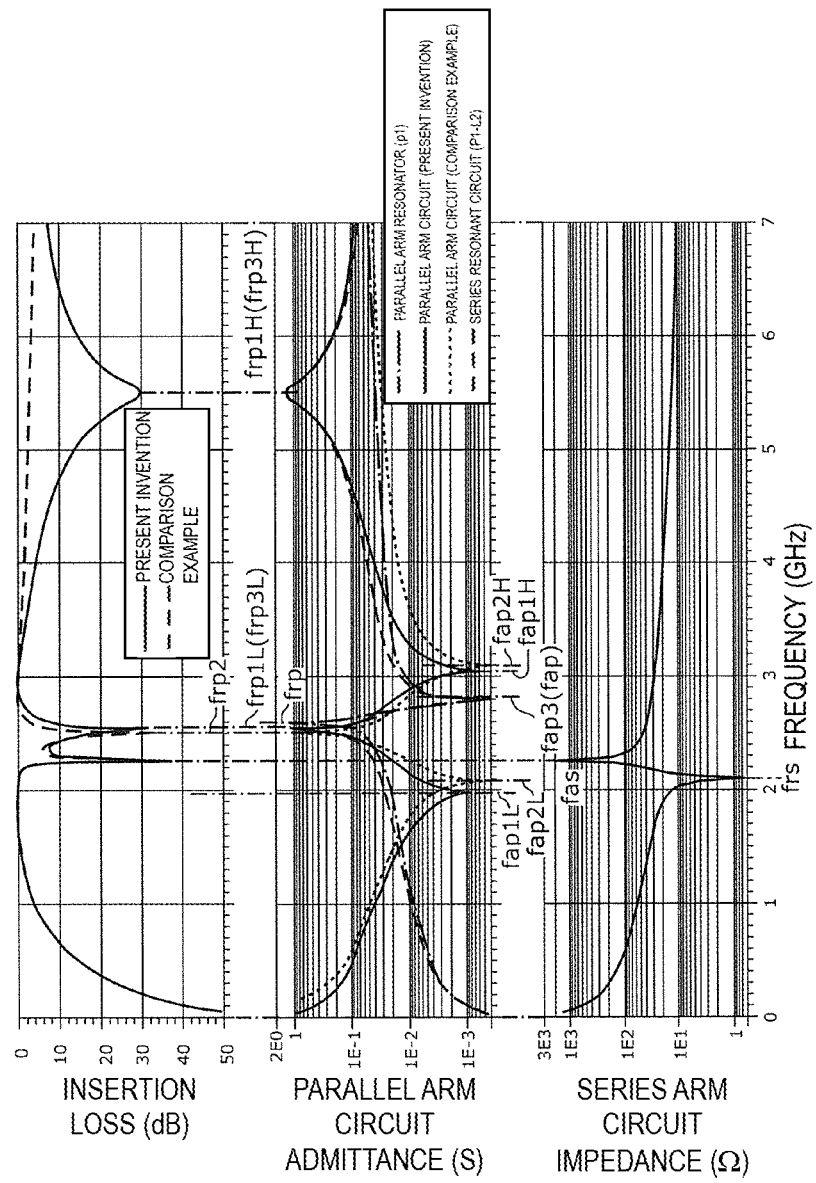
FIG. 2C is a graph illustrating transmission characteristics of the filter devices according to the embodiment 1 and the comparison example, admittance characteristics of the parallel arm circuits, and the impedance characteristic of the series arm circuit.

FIG. 2C is a graph illustrating transmission characteristics of the filters according to the embodiment 1 and the comparison example, admittance characteristics of the parallel arm circuits, and the impedance characteristic of the series arm circuit. Further, FIG. 2D is an enlarged graph illustrating transmission characteristics of the filters according to the embodiment 1 and the comparison example, admittance characteristics of the parallel arm circuits, and the impedance characteristic of the series arm circuit. More specifically, in FIG. 2C and FIG. 2D (the upper parts), the transmission characteristics of the filter 10 according to the present embodiment and the filter 600 according to the comparison example are illustrated. Further, in the FIG. 2C and FIG. 2D (the middle parts), the admittance characteristics of the parallel arm circuit 12 and the parallel arm resonator p1 forming the parallel arm circuit 12 are illustrated, and in the FIG. 2C and FIG. 2D (the lower parts), the impedance characteristic of the series arm resonator s1 is illustrated. Further, in FIG. 2C and FIG. 2D (the middle parts), the admittance characteristic of a parallel arm circuit (p1-L2 series resonant circuit) formed only by connecting the parallel arm resonator p1 and the inductor L2 in series and the admittance characteristic of the parallel arm circuit 612 according to the comparison example.

[1.2.1 Basic Operation Principle of Notch Filter]

Here, first, the basic operation principle of a notch filter (band elimination filter) formed of a series arm resonator s1 and a parallel arm resonator p1 is described.

The parallel arm resonator p1 has a resonant frequency frp at which the admittance $|Y|$ is a local maximum and an anti-resonant frequency fap ($>$frp) at which the admittance $|Y|$ is a local minimum. The series arm resonator s1 has an anti-resonant frequency fas at which the impedance $|Z|$ is a local maximum and a resonant frequency frs ($<$fas$<$fap) at which the impedance |Z| is a local minimum. When forming the notch filter from the series arm resonator s1 and the parallel arm resonator p1, the anti-resonant frequency fas of the series arm resonator s1 and the resonant frequency frp of the parallel arm resonator p1 are set close to each other. This allows to form a low frequency side passband (first passband) near the resonant frequency frs where the impedance of the series arm resonator s1 approaches 0. Further, when the frequency becomes higher than this, the impedance of the series arm resonator s1 increases near the anti-resonant frequency fas, and the admittance of the parallel arm resonator p1 increases near the resonant frequency frp. This allows to form a signal stopband (attenuation band) near the anti-resonant frequency fas to the resonant frequency frp in a signal path from the input/output terminal 110 to the input/output terminal 120. As the frequency increases further and becomes close to the anti-resonant frequency fap, the admittance of the parallel arm resonator p1 approaches 0, and a high frequency side passband (second passband) is formed. That is to say, the stopband is formed by the anti-resonant frequency fas of the series arm resonator s1 and the resonant frequency frp of the parallel arm resonator p1, the low frequency side passband is formed by the resonant frequency frs of the series arm resonator s1, and the high frequency side passband is formed by the anti-resonant frequency fap of the parallel arm resonator p1.

Note that in the filter devices according to the present disclosure, the first passband, the second passband, and the attenuation band between the first passband and the second passband are defined, however, the second passband may not need to be allocated to any radio frequency signal to be propagated. That is to say, the second passband is located on the higher frequency side than the first passband and may be defined as a band where insertion loss is equal to or less than 3 dB.

[1.2.2 Resonant Characteristic and Transmission Characteristic of Filter According to Comparison Example]

On the other hand, as illustrated in FIG. 2B, in the filter 600 according to the comparison example, the parallel arm circuit 612 is formed of a parallel circuit of the parallel arm resonator p1 and the inductor L1. When this configuration is used, as illustrated in FIG. 2C (middle part), the parallel arm circuit 612 formed of the parallel arm resonator p1 having the resonant frequency frp and the anti-resonant frequency fap and the inductor L1 has one resonant frequency frp2 (a local maximum point of the admittance |Y|) and two anti-resonant frequencies fap2L and fap2H (minimum points of the admittance |Y|). Note that the anti-resonant frequency fap2L is located on the low frequency side of the resonant frequency frp2 and the anti-resonant frequency fap2H is located on the high frequency side of the resonant frequency frp2.

In this case, as is the case with the basic operation of the foregoing notch filter, the signal stopband is formed by two attenuation poles at the anti-resonant frequency fas of the series arm resonator s1 and the resonant frequency frp2 of the parallel arm circuit. Note that setting the frequency of the resonant frequency frp2 at the higher frequency side with respect to the anti-resonant frequency fas enables the foregoing signal stopband to have a band width.

Whereas, on the lower frequency side than the foregoing signal stopband, the first passband is formed by the anti-resonant frequency fap2L and the resonant frequency frs of the series arm resonator s1. Here, on the lower frequency side than the foregoing signal stopband, the parallel circuit of the parallel arm resonator p1 and the inductor L1 enables to increase the frequency difference between the anti-resonant frequency fap2L and the resonant frequency frp2, thereby enabling to broaden the width and reduce the loss of the low frequency side passband. Further, the second passband is formed by the anti-resonant frequency fap2H of the parallel arm circuit 612.

Filters to be installed in front-end units of mobile communication devices are required to have properly adjusted passband width, steepness at an end part of the passband, width of the attenuation band, and the like based on a combination of bands to be used in multimode/multiband operation. Particularly, when another band adjacent to the high frequency side of one band has a broad transmitting/receiving band width, there is a need to broaden the attenuation band near the high frequency side of the passband of the one band.

In this case, it is conceivable to adjust the width of the attenuation band by properly adjusting the frequency difference between the anti-resonant frequency fas of the series arm resonator s1 and the resonant frequency frp2 of the parallel arm circuit, which define the attenuation pole on the high frequency side of the passband. However, if the resonant frequency frp2 were shifted to the high frequency side in an attempt to extend the width of the attenuation band, the anti-resonant frequency fap2L defining the passband would also shift to the high frequency side, thereby making it difficult to maintain low-loss property of the passband. Further, if the resonant frequency frp2 of the parallel arm circuit and the anti-resonant frequency fap2L were simply shifted to the high frequency side, bounce-back in the attenuation characteristic in the band between the anti-resonant frequency fas and the resonant frequency frp2 would become larger, thereby posing an issue of not being able to obtain sufficient attenuation in the attenuation band. Further, in a band on the higher frequency side than the second passband, both the series arm circuit 11 and the parallel arm circuit 12 exhibit capacitive characteristics, thereby also posing an issue of not being able to obtain a large attenuation.

[1.2.3 Resonant Characteristic and Transmission Characteristic of Filter 10 According to Embodiment]

With regard to the foregoing issue of the filter 600 according to the comparison example, in the filter 10 according to the present embodiment, the inductor L2 is connected in series to the parallel arm resonator p1. Because of this, as illustrated in FIG. 2D, the frequency difference (resonance band width 1) between the anti-resonant frequency fap1L of the parallel arm circuit 12 and the resonant frequency frp1L of the parallel arm circuit 12 becomes larger than the frequency difference (resonance band width 2) between the anti-resonant frequency fap2L of the parallel arm circuit 612 according to the comparison example and the resonant frequency frp2 of the parallel arm circuit 612. In addition, as illustrated in FIG. 2C, a new resonant frequency frp1H is added on the high frequency side of the anti-resonant frequency fap1H of the parallel arm circuit 12. That is to say, because the resonant band width 1 can be broadened, it is possible to secure low-loss property of the first passband formed by the anti-resonant frequency fap1L of the parallel arm circuit 12 and further to shift the attenuation pole within the signal stopband formed by the resonant frequency frp1L of the parallel arm circuit 12 to a higher frequency side, thereby enabling to extend the width of the attenuation band (first attenuation band).

Further, the filter 10 according to the present embodiment has the resonant frequency frp1H in a harmonic band (second attenuation band) that is separated toward a higher frequency side than the passband. Accordingly, compared with the comparison example, a larger attenuation can be secured in the harmonic band.

Note that the second passband on the higher frequency side than the signal stopband is formed by the anti-resonant frequency fap1H of the parallel arm circuit 12, and compared with the comparison example, in the filter 10 according to the present embodiment, the loss of the second passband may degrade in some cases. However, in the filter 10 according to the present embodiment, the second passband may not need to be allocated to any band to be used.

[1.2.4 Harmonic Attenuation Characteristic of Filter 10]

Each of FIGS. 3A, 3B and 3C is a graph comparing transmission characteristics and admittance characteristics of the filters according to an example 1, an example 2, and the comparison example. In FIG. 3A, the transmission characteristics of the filters according to the example 1, the example 2, and the comparison example are illustrated. In FIG. 3B, the admittance characteristics of the parallel arm circuit 12 of the filter 10 according to the example 1 and the example 2 are illustrated. Further, in FIG. 3C, expanded transmission characteristics of the passband in FIG. 3A and an attenuation band near the high frequency side of the passband in FIG. 3A are illustrated. Note that the filters 10 according to the example 1 and the example 2 have the same circuit configuration as that of the circuit illustrated in FIG. 2A. Further, the filter 600 according to the comparison example has the same circuit configuration as that of the circuit illustrated in FIG. 2B.

In the filter 10 according to the example 1, as illustrated in FIG. 3B, the parallel arm circuit 12 has the resonant frequency frp1L (first resonant frequency) that defines the attenuation pole near the high frequency side of the first passband and the resonant frequency frp1H (second resonant frequency) that is higher than the resonant frequency frp1L. Here, the resonant frequency frp1H in the example 1 is lower than a frequency three times as much as the resonant frequency frp1L. Specifically, the resonant frequency frp1H is defined by the inductance value of the inductor L2, and as the inductance value of the inductor L2 increases, the resonant frequency frp1H shifts to a lower frequency. That is to say, the frequency of the attenuation pole on the high frequency side of the second passband formed by the resonant frequency frp1H is defined and appropriately selected by the inductance value of the inductor L2.

In the filter 10 according to the example 2, as illustrated in FIG. 3B, the parallel arm circuit 12 has the resonant frequency frp1L that defines the attenuation pole near the high frequency side of the first passband and the resonant frequency frp1H. Here, the resonant frequency frp1H in the example 2 is higher than a frequency three times as much as the resonant frequency frp1L.

In the filter 600 according to the comparison example, the parallel arm circuit 612 has, as the resonant frequency, only the resonant frequency that defines the attenuation pole near the high frequency side of the first passband.

The filter 10 according to the example 1 causes the resonant frequency frp1H that defines the attenuation pole in a band that is separated from the second passband toward the higher frequency side to be located in a frequency band lower than a frequency three times as much as the resonant frequency frp1L, and thus the attenuation characteristic can be improved up to the third-order harmonic band that is a frequency band at three times as much as the first passband.

Further, as the resonant frequency frp1H that defines the attenuation pole in the band that is separated from the second passband toward the higher frequency side decreases (as the inductance value of the inductor L2 increases), the frequency difference between the anti-resonant frequency fap1L and the resonant frequency frp1L increases, and the difference between the impedance at the anti-resonant frequency fap1L and the impedance at the resonant frequency frp1L increases. Therefore, as illustrated in the area A of FIG. 3C, compared with the filter 10 according to the example 2, the filter 10 according to the example 1 enables to improve the attenuation in the attenuation band near the high frequency side of the passband.

Each of FIGS. 4A, 4B and 4C is a graph comparing transmission characteristics and admittance characteristics of the filters according to the example 1, an example 3, and the comparison example. In FIG. 4A, the transmission characteristics of the filters according to the example 1, the example 3, and the comparison example are illustrated. In FIG. 4B, the admittance characteristics of the parallel arm circuits 12 of the filters 10 according to the example 1 and the example 3 are illustrated. Further, in FIG. 4C, expanded transmission characteristics of the passband in FIG. 4A and an attenuation band near the high frequency side of the passband in FIG. 4A are illustrated. Note that the filter 10 according to the example 3 has the same circuit configuration as that of the circuit illustrated in FIG. 2A.

In the filter 10 according to the example 1, as illustrated in FIG. 4B, the parallel arm circuit 12 has the resonant frequency frp1L (first resonant frequency) that defines the attenuation pole near the high frequency side of the passband and the resonant frequency frp1H (second resonant frequency) that is higher than the resonant frequency frp1L. Here, the resonant frequency frp1H in the example 1 is higher than a frequency twice as much as the resonant frequency frp1L.

In the filter 10 according to the example 3, as illustrated in FIG. 4B, the parallel arm circuit 12 has the resonant frequency frp1L that defines the attenuation pole near the high frequency side of the passband and the resonant frequency frp1H. Here, the resonant frequency frp1H in the example 3 is lower than a frequency twice as much as the resonant frequency frp1L.

In the filter 600 according to the comparison example, the parallel arm circuit 612 has, as the resonant frequency, only the resonant frequency that defines the attenuation pole near the high frequency side of the passband.

As is the case with the filter 10 according to the example 3, when the resonant frequency frp1H is lower than a frequency twice as much as the resonant frequency frp1L, as illustrated in the area B of FIG. 4C, the resonant frequencies frp1L and frp1H approach too close to the passband, and this degrades the insertion loss at an end part of a high frequency region of the first passband and the insertion loss at an end part of a high frequency region of the second passband. Whereas, according to the filter 10 according to the example 1, the resonant frequency frp1H is higher than a frequency twice as much as the resonant frequency frp1L, and thus the attenuation characteristic can be improved up to the third-order harmonic wave while securing the low-loss of the first passband.

[1.2.5 Resonant Characteristic and Transmission Characteristic of Filter 10 Based on Inductance Value]

Each of FIGS. 5A and 5B is a graph comparing transmission characteristics and admittance characteristics of the parallel arm circuit 12 of the filter 10 according to the embodiment 1 based on the magnitude relationships between the inductors L1 and L2.

Here, when the inductance value of the inductor L1 is large, both the anti-resonant frequency fap1L and the anti-resonant frequency fap1H shift to lower frequencies, the frequency difference between the anti-resonant frequency fap1L and the resonant frequency frp1L increases, and the frequency difference between the resonant frequency frp1L and the anti-resonant frequency fap1H decreases. Accordingly, as illustrated in FIG. 5B, when the inductance value of the inductor L2 is larger than the inductance value of the inductor L1, the anti-resonant frequency fap1L shifts to a higher frequency side, and the width of the resonant band, which is the frequency difference from the resonant frequency frp1L, decreases. That is to say, the anti-resonant frequency fap1L approaches the attenuation pole defined by the resonant frequency frp1L and moves out from the passband. Because of this, as illustrated in FIG. 5A, the insertion loss in the passband increases, and the attenuation in the attenuation band decreases.

On the other hand, when the inductance value of the inductor L2 is smaller than the inductance value of the inductor L1, and the width of the resonant band, which is the frequency difference between the anti-resonant frequency fap1L and the resonant frequency frp1L, is large. That is to say, the anti-resonant frequency fap1L is located within the passband. Because of this, as illustrated in FIG. 5A, the insertion loss in the passband decreases, and the attenuation in the attenuation band improves. That is to say, having the inductance value of the inductor L2 that is smaller than the inductance value of inductor L1 enables to improve the insertion loss of the passband.

Embodiment 2

A filter device according to the present embodiment is different from the filter device according to the embodiment 1 in that the filter device according to the present embodiment includes a plurality of parallel arm circuits and inductors respectively included in the plurality of the parallel arm circuits are magnetically coupled to each other.

[2.1 Circuit Configuration of Filter 20]

FIG. 6A is a specific circuit configuration diagram of a filter 20 according to the embodiment 2. The filter 20 illustrated in FIG. 6A includes a series arm circuit 11, parallel arm circuits 12 and 13, and input/output terminals 110 and 120. In the following, the filter 20 according to the present embodiment is described with the emphasis on the points different from the filter 10 according to the embodiment 1 while omitting descriptions regarding the same points.

The parallel arm circuit 13 is a second parallel arm circuit connected to a node x2 (second node) on a path connecting the input/output terminal 110 and the input/output terminal 120 and ground. The parallel arm circuit 13 includes a parallel arm resonator p2 and inductors L3 and L4. Note that a node x1 (first node) to which the parallel arm circuit 12 is connected is a node connecting the input/output terminal 110 and a series arm resonator s1. Whereas, the node x2 (second node) to which the parallel arm circuit 13 is connected is a node connecting the series arm resonator s1 and the input/output terminal 120 and is different from the node x1.

The parallel arm resonator p2 is a second parallel arm resonator that is connected between the node x2 and the ground and has a resonant frequency located between a first passband and a second passband of the filter 20.

The inductor L4 is a fourth inductor connected between the node x2 and the ground and connected in series to the parallel arm resonator p2.

The inductor L3 is a third inductor connected between the node x2 and the ground. The inductor L3 and the circuit in which the parallel arm resonator p2 and the inductor L4 are connected in series are connected in parallel between the node x2 and the ground.

Further, two resonant frequencies that the parallel arm circuit 12 has, and two resonant frequencies that the parallel arm circuit 13 has are respectively set at substantially the same frequencies.

Compared with the filter 10 according to the embodiment 1, the foregoing configuration enables the filter 20 according to the present embodiment to have a larger attenuation in the signal stopband close to the high frequency side of the first passband and a larger attenuation in the higher frequency side than the second passband by increasing the number of the parallel arm circuits installed therein.

Note that the parallel arm resonator p2 forming the parallel arm circuit 13 is formed of, for example, a single acoustic wave resonator, however, the parallel arm resonator p2 may alternatively be formed of a plurality of split resonators which are serially split. Further, the parallel arm resonator p2 may be an acoustic wave filter using SAW or an acoustic wave filter using BAW. Further, the parallel arm resonator p2 may alternatively be formed of a LC resonant circuit composed of an inductor and a capacitor.

Further, in the filter 20 according to the present embodiment, the inductor L2 and the inductor L4 are magnetically coupled. With regard to this, a detailed description is provided using the transmission characteristic and the mounting structure.

[2.2 Transmission Characteristic and Mounting Structure of Filter 20]

FIG. 6B is a graph comparing transmission characteristics of a filter 20 according to the embodiment 2 based on presence or absence of magnetic coupling. Further, FIGS. 6C, 6D and 6E are a circuit configuration diagram, a plan view and a cross-sectional view illustrating a board mounting configuration of the filter 20 according to the embodiment 2.

As a mounting structure of the filter 20, the configuration in which chip-shaped inductors L1 to L4 are surface-mounted on a mounting board 100 as illustrated in FIG. 6D may be used. More specifically, a SAW chip containing the series arm resonator s1 and the parallel arm resonators p1 and p2 and the chip-shaped inductors L1 to L4 are mounted on the mounting board 100. Here, the inductors L2 and L4 are arranged close to each other. Note that preferably the inductors L2 and L4 are arranged in such a manner as to be shielded from other circuit elements. According to this arrangement configuration, the inductor L2 and the inductor L4 are magnetically coupled.

Further, as illustrated in FIG. 6E, the configuration in which the inductors L2 and L4 formed of planar coil patterns and via wirings are embedded inside the mounting board 100 may alternatively be used. More specifically, a SAW chip containing the series arm resonator s1 and the parallel arm resonators p1 and p2 and the chip-shaped inductors L1 and L3 are mounted on the mounting board 100, and the inductors L2 and L4 are embedded inside the mounting board 100. Here, the inductors L2 and L4 are arranged in the thickness direction of the mounting board 100, and an electrode for shielding a magnetic field is not placed in a part in between the patterns forming the inductors L2 and L4. According to this arrangement configuration, the inductor L2 and the inductor L4 are magnetically coupled. Note that the inductor L2 and the inductor L4 may alternatively be arranged side by side in a planar direction.

According to the foregoing configurations of FIG. 6D and FIG. 6E, a main signal path going through the parallel arm circuit 12, the series arm circuit 11, and the parallel arm circuit 13 and a secondary signal path formed by magnetic coupling with which the inductor L2 and the inductor L4 are coupled are formed. Accordingly, as illustrated in FIG. 6B, it is considered that the phase in the main signal path and the phase in the secondary signal path become substantially the same in the low frequency side (area C) of the first passband, thereby improving the insertion loss, and in the higher frequency side than the second passband, these foregoing two phases are substantially reversed, thereby cancelling each other's signal out and improving the attenuation.

That is to say, as illustrated in FIG. 6B, compared with the transmission characteristic of the filter 10, in the transmission characteristic of the filter 20, it becomes possible to: (1) extend the width of the passband by improving the insertion loss on the low frequency side of the passband (area C); and (2) improve the attenuation near a frequency band (area D) in which the resonant frequency on the higher frequency side of two resonant frequencies defined by the parallel arm circuits 12 and 13 is located.

Note that as the mounting board 100, for example, a low temperature co-fired ceramics (LTCC) board, a PCB multilayer board, or the like may be used.

[2.3 Circuit Configuration of Filter 30 According to Modified Example]

FIG. 7A is a specific circuit configuration diagram of a filter 30 according to a modified example of the embodiment 2. The filter 30 illustrated in FIG. 7A includes a series arm circuit 11, parallel arm circuits 12 and 13, and input/output terminals 110 and 120. The filter device 30 according to the present modified example is different from the filter 20 according to the embodiment 2 in that in addition to the magnetic coupling of the inductors L2 and L4, the inductor L1 and the inductor L3 are magnetically coupled. In the following, the filter 30 according to the present modified example is described with the emphasis on the points different from the filter 20 according to the embodiment 2 while omitting descriptions regarding the same points.

In the filter 30 according to the present modified example, the inductor L1 and the inductor L3 are magnetically coupled. With regard to this, a detailed description is provided using the transmission characteristic and the mounting structure.

[2.4 Transmission Characteristic and Mounting Structure of Filter 30]

FIG. 7B is a graph comparing transmission characteristics of the filter 30 according to the modified example of the embodiment 2 based on presence or absence of magnetic coupling. Further, FIGS. 7C, 7D and 7E are a circuit configuration diagram, a plan view and a cross-sectional view illustrating a board mounting configuration of the filter 30 according to the modified example of the embodiment 2.

As a mounting structure of the filter 30, the configuration in which chip-shaped inductors L1 to L4 are surface-mounted on the mounting board 100 as illustrated in FIG. 7D may be used. More specifically, a SAW chip containing the series arm resonator s1 and the parallel arm resonators p1 and p2 and the chip-shaped inductors L1 to L4 are mounted on the mounting board 100. Here, the inductors L2 and L4 are arranged close to each other, and the inductors L1 and L3 are arranged close to each other. Note that the inductors L1 and L3 are preferably arranged in such a way that the inductors L1 and L3 are shielded together with other circuit elements including the inductors L2 and L4. According to this arrangement configuration, the inductor L1 and the inductor L3 are magnetically coupled.

Alternatively, as illustrated in FIG. 7E, the configuration in which the inductors L1 to L4 formed of planar coil patterns and via wirings are embedded inside the mounting board 100 may be used. More specifically, a SAW chip containing the series arm resonator s1 and the parallel arm resonators p1 and p2 is mounted on the mounting board 100, and the inductors L1 to L4 are embedded inside the mounting board 100. Here, the inductors L2 and L4 are arranged in the thickness direction of the mounting board 100, and an electrode for shielding a magnetic field is not placed in a part in between the patterns forming the inductors L2 and L4. Further, the inductors L1 and L3 are arranged in the thickness direction of the mounting board 100, and an electrode for shielding a magnetic field is not placed in a part in between the patterns forming the inductors L1 and L3. According to this arrangement configuration, the inductor L2 and the inductor L4 are magnetically coupled, and the inductor L1 and the inductor L3 are magnetically coupled. Note that the inductor L2 and the inductor L4 may be arranged side by side in the planar direction, and further, the inductor L1 and the inductor L3 may be arranged side by side in the planar direction.

According to the foregoing configurations of FIG. 7D and FIG. 7E, as illustrated in FIG. 7B, it becomes possible to add a new attenuation pole on the low frequency side (area E) of the first passband and steepen an attenuation slope on the low frequency side of the first passband by a capacitive component on the lower frequency side than the resonant frequency of the series arm resonator s1 and an equivalent inductor (La' in the upper right part of FIG. 8, which will be described below) formed by magnetically coupling the inductor L2 and the inductor L4 and connected in parallel to the series arm resonator s1.

That is to say, as illustrated in FIG. 7B, compared with the transmission characteristic of the filter 10 according to the embodiment 1, in the transmission characteristic of the filter 30, it becomes possible to: (1) extend the width of the passband by improving the insertion loss on the low frequency side of the passband (area C); and (2) improve the attenuation near a frequency band (area D) in which the resonant frequency on the higher frequency side of two resonant frequencies defined by the parallel arm circuits 12 and 13 is located. Further, compared with the transmission characteristic of the filter 20 according to the embodiment 2, in the transmission characteristic of the filter 30, it becomes possible to (3) steepen an attenuation pole on the low frequency side of the passband (area E).

Note that in the present embodiment, the modes of the magnetic coupling between the inductors L2 and L4 and the magnetic coupling between the inductor L1 and L3 are described, and these magnetic couplings can be realized by using a circuit illustrated in FIG. 8.

FIG. 8 is a diagram illustrating a circuit configuration of the filter 30 according to the modified example of the embodiment 2 for magnetic coupling. On the left side of FIG. 8, an example of the filter 30 in which the inductor L1 and the inductor L3 are magnetically coupled is illustrated. On the other hand, on the upper right side of FIG. 8, an example is illustrated, in which the magnetic coupling between the inductor L1 and the inductor L3 is realized using another circuit configuration. That is to say, this example is the circuit configuration including inductors L1' and L3' corresponding to an equivalent circuit in which the inductors L1 and L3 are magnetically coupled and an inductor La' connecting the inductors L1 and L3. That is to say, the inductor La' and the inductors L1' and L3' have the same functionality as that of the circuit in which the inductors L1 and L3 are magnetically coupled. Further, this circuit configuration can also be realized using a circuit illustrated on the lower right side of the FIG. 8. That is to say, this example is the circuit configuration in which the parallel arm resonators p1 and p2 are connected using the inductors L1' and L3' and the inductor La' is connected to a connection point of the inductors L1' and L3'. The circuit configurations illustrated on the right side of FIG. 8 also enable the realization of the same functionality as that of the circuit included in the filters 20 and 30 according to the present embodiment, in which the magnetic coupling is formed.

Embodiment 3

In contrast with the configurations of the filters according to the embodiments 1 and 2, in the present embodiment, a filter capable of varying the width of the attenuation band on the high frequency side of a passband is described.

[3.1 Circuit Configuration of Filter 40]

FIG. 9A is a specific circuit configuration diagram of a filter 40 according to an embodiment 3. The filter 40 illustrated in FIG. 9A includes a series arm circuit 11, a parallel arm circuit 14, and input/output terminals 110 and 120. The filter 40 according to the present embodiment is different from the filter 10 according to the embodiment 1 in that the parallel arm circuit 14 is installed in place of the parallel arm circuit 12. In the following, the filter 40 according to the present embodiment is described with the emphasis on the points different from the filter 10 according to the embodiment 1 while omitting descriptions regarding the same points.

The parallel arm circuit 14 is a first parallel arm circuit connected to a node x1 (first node) on a path connecting the input/output terminal 110 and the input/output terminal 120 and ground. The parallel arm circuit 14 includes a parallel arm resonator p1, inductors L1 and L2, and a switch SW1.

The parallel arm resonator p1 is a first parallel arm resonator that is connected between the node x1 and the ground and has a resonant frequency located between a first passband and a second passband.

The inductor L2 is a second inductor connected between the node x1 and the ground and connected in series to the parallel arm resonator p1.

The switch SW1 is a first switch connected in parallel to the inductor L2. When the switch SW1 is electrically continuous (on), the parallel arm resonator p1 is in the state where the parallel arm resonator p1 is directly connected to the node x1 and the ground, thereby forming a signal path that does not go through the inductor L2. Whereas, when the switch SW1 is not electrically continuous (off), a signal path that goes through the parallel arm resonator p1 and the inductor L2 is formed.

The inductor L1 is a first inductor connected between the node x1 and the ground. The inductor L1 and a circuit formed of the parallel arm resonator p1, the inductor L2, and the switch SW1 are connected in parallel between the node x1 and the ground.

[3.2 Transmission Characteristic of Filter 40]

FIG. 9B is a graph comparing transmission characteristics of a filter 40 according to the embodiment 3 based on switching between on and off of the switch (on/off operation).

As illustrated in FIG. 9B, when the switch SW1 is turned on, the circuit state is such that the inductor L2 of the parallel arm circuit 14 is not contributing. Thus, the resonant frequency on the lower frequency side of two resonant frequencies of the parallel arm circuit 14 shifts to a lower frequency side, and the resonant frequency (resonant point) on the higher frequency side disappears. Whereas, when the switch SW1 is turned off, the circuit state is such that the inductor L2 of the parallel arm circuit 14 is contributing. Thus, the resonant frequency on the lower frequency side of two resonant frequencies of the parallel arm circuit 14 shifts to a higher frequency side, and the resonant frequency (resonant point) on the higher frequency side appears.

This enables to vary the width of the attenuation band close to the high frequency side of the first passband by varying the attenuation pole defined by the resonant frequency on the foregoing low frequency side by switching between on and off of the switch SW1. Further, switching between presence and absence of the resonant frequency on the high frequency side of the second passband by switching between on and off of the switch SW1 enables to vary the attenuation characteristic in the harmonic band.

Note that in the present embodiment, only one parallel arm circuit 14 is used as a constituting element, however, for example, in addition to the parallel arm circuit 14, the parallel arm circuit 12 illustrated in FIG. 6A or FIG. 7A may be installed. In this case, the inductors L1 to L4 of the two parallel arm circuits 12 and 14 may be magnetically coupled or may not be magnetically coupled.

[3.3 Circuit Configuration of Filter 50 According to Modified Example]

FIG. 10A is a specific circuit configuration diagram of a filter 50 according to a modified example of the embodiment 3. The filter 50 illustrated in FIG. 10A includes a series arm circuit 11, parallel arm circuits 14 and 15, and input/output terminals 110 and 120. The filter 50 according to the present modified example is different from the filter 40 according to the embodiment 3 in that the parallel arm circuit 15 is further installed. In the following, the filter 50 according to the present modified example is described with the emphasis on the points different from the filter 40 according to the embodiment 3 while omitting descriptions regarding the same points.

The parallel arm circuit 15 is a second parallel arm circuit connected to a node x2 (second node) on a path connecting the input/output terminal 110 and the input/output terminal 120 and ground. The parallel arm circuit 15 includes a parallel arm resonator p2, inductors L3 and L4, and a switch SW2. Note that the node x2 to which the parallel arm circuit 15 is connected is a node connecting the series arm resonator s1 and the input/output terminal 120. Whereas, the node x1 to which the parallel arm circuit 14 is connected is a node connecting the input/output terminal 110 and the series arm resonator s1 and is different from the node x2.

The parallel arm resonator p2 is a second parallel arm resonator that is connected between the node x2 and the ground and has a resonant frequency located between a first passband and a second passband.

The inductor L4 is a fourth inductor connected between the node x2 and the ground and connected in series to the parallel arm resonator p2.

The switch SW2 is a second switch connected in parallel to the inductor L4. When the switch SW2 is electrically continuous (on), the parallel arm resonator p2 is in the state where the parallel arm resonator p2 is directly connected to the node x2 and the ground, thereby forming a signal path that does not go through the inductor L4. Whereas, when the switch SW2 is not electrically continuous (off), a signal path that goes through the parallel arm resonator p2 and the inductor L4 is formed.

The inductor L3 is a third inductor connected between the node x2 and the ground. The inductor L3 and a circuit formed of the parallel arm resonator p2, the inductor L4, and the switch SW2 are connected in parallel between the node x2 and the ground.

[3.4 Transmission Characteristic of Filter 50]

FIG. 10B is a graph comparing transmission characteristics of the filter 50 according to the modified example of the embodiment 3 based on switch's on/off operation.

As illustrated in FIG. 10B, when the switches SW1 and SW2 are turned on, the circuit state is such that the inductor L2 of the parallel arm circuit 14 and the inductor L4 of the parallel arm circuit 15 are not contributing. Thus, the resonant frequency on the lower frequency side of two resonant frequencies of the parallel arm circuit shifts to a lower frequency side, and the resonant frequency (resonant point) on the higher frequency side disappears. Whereas, when the switches SW1 and SW2 are turned off, the circuit state is such that the inductors L2 and L4 of the parallel arm circuits are contributing. Thus, the resonant frequency on the lower frequency side of two resonant frequencies of the parallel arm circuit shifts to a higher frequency side, and the resonant frequency (resonant point) on the higher frequency side appears.

This enables to vary the width of the attenuation band close to the high frequency side of the first passband by varying the attenuation pole defined by the resonant frequency on the foregoing low frequency side by switching between on and off of the switches SW1 and SW2. Further, switching between presence and absence of the resonant frequency on the higher frequency side than the second passband by switching between on and off of the switches SW1 and SW2 enables to vary the attenuation characteristic in the harmonic band.

Note that the present modified example is illustrated by using an example in which the inductors L1 to L4 of the two parallel arm circuits 14 and 15 are magnetically coupled, however, the inductors L1 to L4 may not be magnetically coupled.

Further, the foregoing modified example is illustrated by using an example in which the switches SW1 and SW2 are both turned on or both turned off, however, only one of the switches SW1 and SW2 may be turned on, and the other may be turned off. In this case, the width of the attenuation band near the high frequency side of the passband and the attenuation characteristic of the harmonic band can be varied in a stepwise fashion.

Note that the switches SW1 and SW2 in the embodiment 3 are, for example, single pole single throw (SPST) type switch elements. The switches SW1 and SW2 each make its connection node electrically continuous or electrically discontinuous by switching between the electrically continuous state (on) and the electrically discontinuous state (off) in response to a control signal from a control unit.

As the switches SW1 and SW2, for example, a field effect transistor (FET) switch composed of GaAs or complementary metal oxide semiconductor (CMOS) or a diode switch may be used. This enables to form each of the switches SW1 and SW2 from a single FET switch or diode switch, thereby enabling to downsize the filter 40 and the filter 50.

Embodiment 4

[4.1 Circuit Configurations of Multiplexer 6 and Radio Frequency Front-End Circuit 5]

The filters described in the embodiments 1 to 3 and their modified examples are applicable to the multiplexer, the radio frequency front-end circuit, and the communication device. Thus, in the present embodiment, configurations of a multiplexer 6, a radio frequency front-end circuit 5, and a communication device 1 are described.

FIG. 11A is a circuit configuration diagram of the multiplexer 6, the radio frequency front-end circuit 5, and the communication device 1 according to an embodiment 4. In FIG. 11A, the communication device 1 is illustrated. The communication device 1 is formed of an antenna element 2, the radio frequency front-end circuit 5, a RF signal processing circuit (RFIC) 3, and a baseband signal processing circuit (BBIC) 4. The antenna element 2, the radio frequency front-end circuit 5, and the RFIC 3 are installed in, for example, a front-end unit of a multimode/multiband cellular phone.

The antenna element 2 is a multiband antenna transmitting/receiving a radio frequency signal and conforms to communications standards such as, for example, LTE and the like. Note that the antenna element 2 may not be included inside the communication device 1.

The RFIC 3 is a RF signal processing circuit that processes a radio frequency signal being transmitted or received by the antenna element 2. Specifically, the RFIC 3 performs signal processing on a radio frequency received signal input via a receiving-side signal path from the antenna element 2 to the radio frequency front-end circuit 5 using down-converting and the like, and outputs a received signal generated by this signal processing to the BBIC 4. Further, the RFIC 3 performs signal processing on a transmitting signal input from the BBIC 4 using up-converting and the like, and outputs a radio frequency transmitting signal generated by this signal processing to a transmitting-side signal path (not illustrated).

The radio frequency front-end circuit 5 is a circuit that transmits a radio frequency signal between the antenna element 2 and the RFIC 3. Specifically, the radio frequency front-end circuit 5 transmits a radio frequency received signal received by the antenna element 2 to the RFIC 3 via the receiving-side signal path.

The radio frequency front-end circuit 5 includes the multiplexer 6 and receiving amplifier circuits 7A and 7B. The multiplexer includes filters 60 and 70. The filters 60 and 70 are connected to a common terminal.

The filter 60 is one of the filters 10 to 50 according to the embodiments 1 to 3 and their modified examples and has a first passband fB60 and an attenuation band near the high frequency side of the first passband fB60. The filter 60 according to the present embodiment is a filter circuit including the configuration of the filter 30 according to the modified example of the embodiment 2 and is different from the filter 30 in that three series arm resonators s1, s2, and s3 are installed therein. Note that the second passband is not allocated to any band to be used.

The filter 70 is a first filter having a passband fB70 (>fB60) on the higher frequency side than the first passband fB60 of the filter 60. The passband fB70 is included in the foregoing attenuation band of the filter 60.

The receiving amplifier circuits 7A and 7B are formed of one or more low noise amplifiers that amplify power of a radio frequency received signal input from the filters 60 and 70, respectively. Note that the receiving amplifier circuits 7A and 7B may be formed of a single amplifier circuit using a single pole double throw (SPOT) type switch.

Further, the filters 60 and 70 may not be directly connected to the common terminal. For example, the filters 60 and 70 may be indirectly connected to the common terminal by installing a branch circuit such as a switch between the common terminal and the filters 60 and 70.

According to the foregoing configuration, the radio frequency front-end circuit 5 filters a radio frequency received signal input from the antenna element 2 with the filters 60 and 70, amplifies with the receiving amplifier circuits 7A and 7B, and outputs to the RFIC 3.

Note that when the filter 40 according to the embodiment 3 and the filter 50 according to its modified example are applied to the filter 60, the radio frequency front-end circuit 5 includes a control unit that controls on and off of the switches SW1 and SW2. Further, this control unit may be not be included in the radio frequency front-end circuit 5 and may be included in the RFIC 3.

[4.2 Transmission Characteristic of Multiplexer 6]

FIG. 11B is a graph illustrating the transmission characteristics of the multiplexer 6 according to the embodiment 4. As illustrated in FIG. 11B, the filter 60 has a low-loss transmission characteristic in the first passband fB60 and a broad attenuation band near the high frequency side of the first passband fB60. Note that the second passband is not allocated to any band to be used. Whereas, the filter 70 has a low-loss transmission characteristic in the passband fB70. Here, the attenuation band near the high frequency side of the filter 60 includes the passband fB70 of the filter 70.

FIG. 11C is a graph comparing transmission characteristics of multiplexers according to the embodiment 4 and a comparison example. The multiplexer according to the comparison example illustrated in FIG. 11C is a multiplexer in which the filter according to the comparison example of the embodiment 1 is applied to a filter on the low frequency side and the filter 70 is applied to a filter on the high frequency side. As illustrated in the graph in the lower part of FIG. 11C, compared with the multiplexer according to the comparison example, in the multiplexer 6 according to the present embodiment, the width of the attenuation band of the filter 60 is extended, and thus the insertion loss in the passband of the filter 70 is improved.

Further, compared with the multiplexer according to the comparison example, in the multiplexer 6 according to the present embodiment, the attenuation characteristic in the harmonic band of the filter 60 is improved.

As described above, according to the multiplexer 6 according to the present embodiment, the attenuation band on the high frequency side of the passband of the filter 60 on the low frequency side is broadened, and this enables to reduce the insertion loss of the filter 70 that uses this attenuation band as its passband.

Further, the radio frequency front-end circuit 5 and the communication device 1, each of which includes the filter 60 in which the width of the attenuation band near the high frequency side of the passband is extended, can be provided.

OTHER EMBODIMENTS

The filter devices, the multiplexer, the radio frequency front-end circuit, and the communication device according to the present disclosure have been described using the embodiments 1 to 4 and their modified examples. However, the filter device, the multiplexer, the radio frequency front-end circuit, and the communication device according to the present disclosure are not limited to the foregoing embodiments and their modified examples. Other embodiments realized by combining arbitrary constituting elements of the foregoing embodiments and their modified examples, modified examples obtained by applying various modifications apparent to those skilled in the art to the foregoing embodiments without departing the scope of the present disclosure, and various devices including the filter device, the multiplexer, the radio frequency front-end circuit, and the communication device of the present disclosure may also be included in the present disclosure.

Note that the filters according to the foregoing embodiments 1 to 4 and their modified examples are described as being applied to systems that select frequency bands close to each other. Alternatively, the filters according to the foregoing embodiments 1 to 4 and their modified examples can be applied to systems that switch between a plurality of channels close to each other, which are allocated within a single frequency band.

Further, in the filter devices, the multiplexer, the radio frequency front-end circuit, and the communication device according to the embodiments 1 to 4 and their modified examples, inductive elements, capacitive elements, and filter elements may be further connected in between each input/output terminal and the common terminal. Further, an inductance component of wiring connecting each circuit element may also be included.

The present disclosure can be widely used in communication equipment such as cellular phones and the like as a small-size filter device, a multiplexer, a radio frequency front-end circuit, and a communication device, each of which can be applied to a multiband-and-multimode system that uses a plurality of bands close to each other simultaneously or exclusively.

1 Communication device
2 Antenna element
3 RF signal processing circuit (RFIC)
4 Baseband signal processing circuit (BBIC)
5 Radio frequency front-end circuit
6 Multiplexer
7A, 7B Receiving amplifier circuit
10, 20, 30, 40, 50, 60, 70 Filter
11 Series arm circuit
12, 13, 14, 15 Parallel arm circuit
100 Mounting board
110, 120 Input/output terminal
500 SAW filter
510A, 510B Filter circuit
511, 515 Series arm SAW resonator
512, 516 Parallel arm SAW resonator
514, 518, 519, L1, L2, L3, L4 Inductor
p1 Parallel arm resonator
s1, s2, s3 Series arm resonator
SW1, SW2 Switch

The invention claimed is:

1. A filter device having a first passband and a second passband located on a higher frequency side than the first passband, the filter device comprising:
    a series arm circuit connected between a first input/output terminal and a second input/output terminal; and
    a first parallel arm circuit connected to a first node on a path connecting the first input/output terminal and the second input/output terminal and ground, wherein
    the first parallel arm circuit includes
        a first parallel arm resonator connected between the first node and the ground and having a resonant frequency located between the first passband and the second passband,
        a first inductor connected between the first node and the ground, and
        a second inductor connected between the first node and the ground and connected in series to the first parallel arm resonator, wherein a circuit in which the first parallel arm resonator and the second inductor are connected in series is connected in parallel to the first inductor.

2. The filter device according to claim 1, wherein
the first parallel arm circuit has a first resonant frequency and a second resonant frequency located on the higher frequency side than the first resonant frequency, and
the second resonant frequency is lower than a frequency three times as much as the first resonant frequency.

3. The filter device according to claim 2, wherein
the second resonant frequency is higher than a frequency twice as much as the first resonant frequency.

4. The filter device according to claim 1, wherein
an inductance value of the second inductor is smaller than an inductance value of the first inductor.

5. The filter device according to claim 1, wherein
the first parallel arm circuit further includes a first switch connected in parallel to the second inductor.

6. The filter device according to claim 5, further comprising:
a second parallel arm circuit connected to a second node and the ground, the second node being on the path and being different from the first node, wherein
the second parallel arm circuit includes
a second parallel arm resonator connected between the second node and the ground and having a resonant frequency located between the first passband and the second passband,
a third inductor connected between the second node and the ground,
a fourth inductor connected between the second node and the ground and connected in series to the second parallel arm resonator, and
a second switch connected in parallel to the fourth inductor, wherein
a circuit in which the second parallel arm resonator and the fourth inductor are connected in series is connected in parallel to the third inductor.

7. The filter device according to claim 6, wherein
the second parallel arm circuit has a third resonant frequency and a fourth resonant frequency located on a higher frequency side than the third resonant frequency, and
the fourth resonant frequency is lower than a frequency three times as much as the third resonant frequency.

8. The filter device according to claim 7, wherein
the fourth resonant frequency is higher than a frequency twice as much as the third resonant frequency.

9. The filter device according to claim 6, wherein
an inductance value of the fourth inductor is smaller than an inductance value of the third inductor.

10. The filter device according to claim 1, further comprising:
a second parallel arm circuit connected to a second node and the ground, the second node being on the path and being different from the first node, wherein
the second parallel arm circuit includes
a second parallel arm resonator connected between the second node and the ground and having a resonant frequency located between the first passband and the second passband,
a third inductor connected between the second node and the ground, and
a fourth inductor connected between the second node and the ground and connected in series to the second parallel arm resonator, wherein:

a circuit in which the second parallel arm resonator and the fourth inductor are connected in series is connected in parallel to the third inductor, and
the second inductor and the fourth inductor are magnetically coupled.

11. The filter device according to claim 10, wherein
the second parallel arm circuit has a third resonant frequency and a fourth resonant frequency located on a higher frequency side than the third resonant frequency, and
the fourth resonant frequency is lower than a frequency three times as much as the third resonant frequency.

12. The filter device according to claim 11, wherein
the fourth resonant frequency is higher than a frequency twice as much as the third resonant frequency.

13. The filter device according to claim 10, wherein
an inductance value of the fourth inductor is smaller than an inductance value of the third inductor.

14. The filter device according to claim 10, wherein
the first inductor and the third inductor are magnetically coupled.

15. The filter device according to claim 10, wherein
the first parallel arm circuit further includes a first switch connected in parallel to the second inductor, and
the second parallel arm circuit further includes a second switch connected in parallel to the fourth inductor.

16. The filter device according to claim 1, wherein
the series arm circuit includes a series arm resonator connected between the first input/output terminal and the second input/output terminal,
a resonant frequency of the series arm resonator is lower than a resonant frequency of the first parallel arm resonator,
the first parallel arm circuit has a first resonant frequency, a second resonant frequency located on a higher frequency side than the first resonant frequency, a first anti-resonant frequency, and a second anti-resonant frequency located on a higher frequency side than the first anti-resonant frequency,
the resonant frequency of the series arm resonator and the first anti-resonant frequency of the first parallel arm circuit are located within the first passband,
an anti-resonant frequency of the series arm resonator and the first resonant frequency of the first parallel arm circuit define a first attenuation band on a high frequency side close to the first passband,
the second anti-resonant frequency of the first parallel arm circuit defines the second passband, and
the second resonant frequency of the first parallel arm circuit defines a second attenuation band on a higher frequency side than the second passband.

17. The filter device according to claim 6, wherein
the series arm circuit includes a series arm resonator connected between the first input/output terminal and the second input/output terminal,
a resonant frequency of the series arm resonator is lower than a resonant frequency of the first parallel arm resonator,
the first parallel arm circuit has a first resonant frequency, a second resonant frequency located on a higher frequency side than the first resonant frequency, a first anti-resonant frequency, and a second anti-resonant frequency located on a higher frequency side than the first anti-resonant frequency,
the second parallel arm circuit has a third resonant frequency, a fourth resonant frequency located on a higher frequency side than the third resonant frequency, a third anti-resonant frequency, and a fourth anti-resonant frequency located on a higher frequency side than the third anti-resonant frequency, the resonant frequency of the series arm resonator, the first anti-resonant frequency, and the third anti-resonant frequency are located within the first passband, an anti-resonant frequency of the series arm resonator, the first resonant frequency, and the third resonant frequency define a first attenuation band on a high frequency side close to the first passband, the second anti-resonant frequency and the fourth anti-resonant frequency define the second passband, the second resonant frequency and the fourth resonant frequency define a second attenuation band on a higher frequency side than the second passband.

18. A multiplexer comprising:

a common terminal;

the filter device according to claim 1; and a first filter having a passband on a higher frequency side than the first passband of the filter device, wherein the first input/output terminal and the first filter are connected to the common terminal.

19. A radio frequency front-end circuit comprising:

the filter device according to claim 1; and an amplifier circuit connected to the filter device.

20. A communication device comprising:

a RF signal processing circuit that processes a radio frequency signal being transmitted or received by an antenna element; and the radio frequency front-end circuit according to claim 19 that transmits the radio frequency signal between the antenna element and the RF signal processing circuit.

* * * * *

UNITED STATES PATENT AND TRADEMARK OFFICE
CERTIFICATE OF CORRECTION

| | |
|---|---|
| PATENT NO. | : 11,146,242 B2 |
| APPLICATION NO. | : 16/546827 |
| DATED | : October 12, 2021 |
| INVENTOR(S) | : Sugahara et al. |

It is certified that error appears in the above-identified patent and that said Letters Patent is hereby corrected as shown below:

In the Specification

Column 22, Line 62:
"throw (SPOT) type switch." should be "throw (SPDT) type switch."

Signed and Sealed this
Nineteenth Day of July, 2022

Katherine Kelly Vidal
*Director of the United States Patent and Trademark Office*